(12) United States Patent
Shibuta et al.

(10) Patent No.: US 12,706,524 B2
(45) Date of Patent: Aug. 11, 2026

(54) SIGNAL TRANSMISSION CIRCUIT AND POWER CONVERSION APPARATUS

(71) Applicant: Mitsubishi Electric Corporation, Tokyo (JP)

(72) Inventors: Yuto Shibuta, Fukuoka (JP); Shohei Higashi, Fukuoka (JP)

(73) Assignee: Mitsubishi Electric Corporation, Tokyo (JP)

( * ) Notice: Subject to any disclaimer, the term of this patent is extended or adjusted under 35 U.S.C. 154(b) by 221 days.

(21) Appl. No.: 18/764,518

(22) Filed: Jul. 5, 2024

(65) Prior Publication Data

US 2025/0132684 A1 Apr. 24, 2025

(30) Foreign Application Priority Data

Oct. 19, 2023 (JP) ................................ 2023-180219

(51) Int. Cl.
*H02M 1/08* (2006.01)
*H03K 17/691* (2006.01)
*H02M 7/521* (2006.01)

(52) U.S. Cl.
CPC ............ *H02M 1/08* (2013.01); *H03K 17/691* (2013.01); *H02M 7/521* (2013.01)

(58) Field of Classification Search
CPC ......... H02M 3/33515; H02M 3/33592; H02M 3/33569; H02M 1/0022; H02M 1/08; H02M 1/088; H02M 1/32; H02M 1/0038; H02M 7/521; H03K 17/691
See application file for complete search history.

(56) References Cited

U.S. PATENT DOCUMENTS 5,142,432 A * 8/1992 Schneider ............ H03K 17/691 340/662
2015/0381029 A1* 12/2015 Gan ..................... H03K 17/082 363/53
2018/0175847 A1* 6/2018 Morokuma .......... H03K 17/691
2019/0222107 A1* 7/2019 Morokuma .......... H03K 17/691
(Continued)

FOREIGN PATENT DOCUMENTS

JP 2012-257421 A 12/2012
WO 2016/199536 A1 12/2016
(Continued)

*Primary Examiner* — Monica Lewis
*Assistant Examiner* — Jye-June Lee
(74) *Attorney, Agent, or Firm* — Studebaker Brackett PLLC

(57) ABSTRACT

A first circuit generates a transmission signal according to a change in a logical value of a first signal using a first potential as a reference. A transformer includes a first coil to which a transmission signal is input and a second coil inductively coupled to the first coil to output a pair of reception signals. The second circuit generates a second signal by performing comparison with hysteresis with respect to the potential difference between the pair of reception signals using a second potential as a reference. The second circuit includes a detection circuit performing comparison and outputting a result of detecting whether the potential difference exceeds a predetermined range as the second signal, and a reset circuit resetting an operation of the detection circuit when a logical value of the second signal is maintained in a preset period.

18 Claims, 17 Drawing Sheets

(56) References Cited

U.S. PATENT DOCUMENTS

2021/0328519 A1* 10/2021 Fabbro ................. H03K 17/691
2023/0101061 A1* 3/2023 Fabbro ................. H03K 17/691
361/115

FOREIGN PATENT DOCUMENTS

WO 2018/066165 A1 4/2018
WO WO-2021210050 A1 * 10/2021 .............. H02M 1/08

* cited by examiner

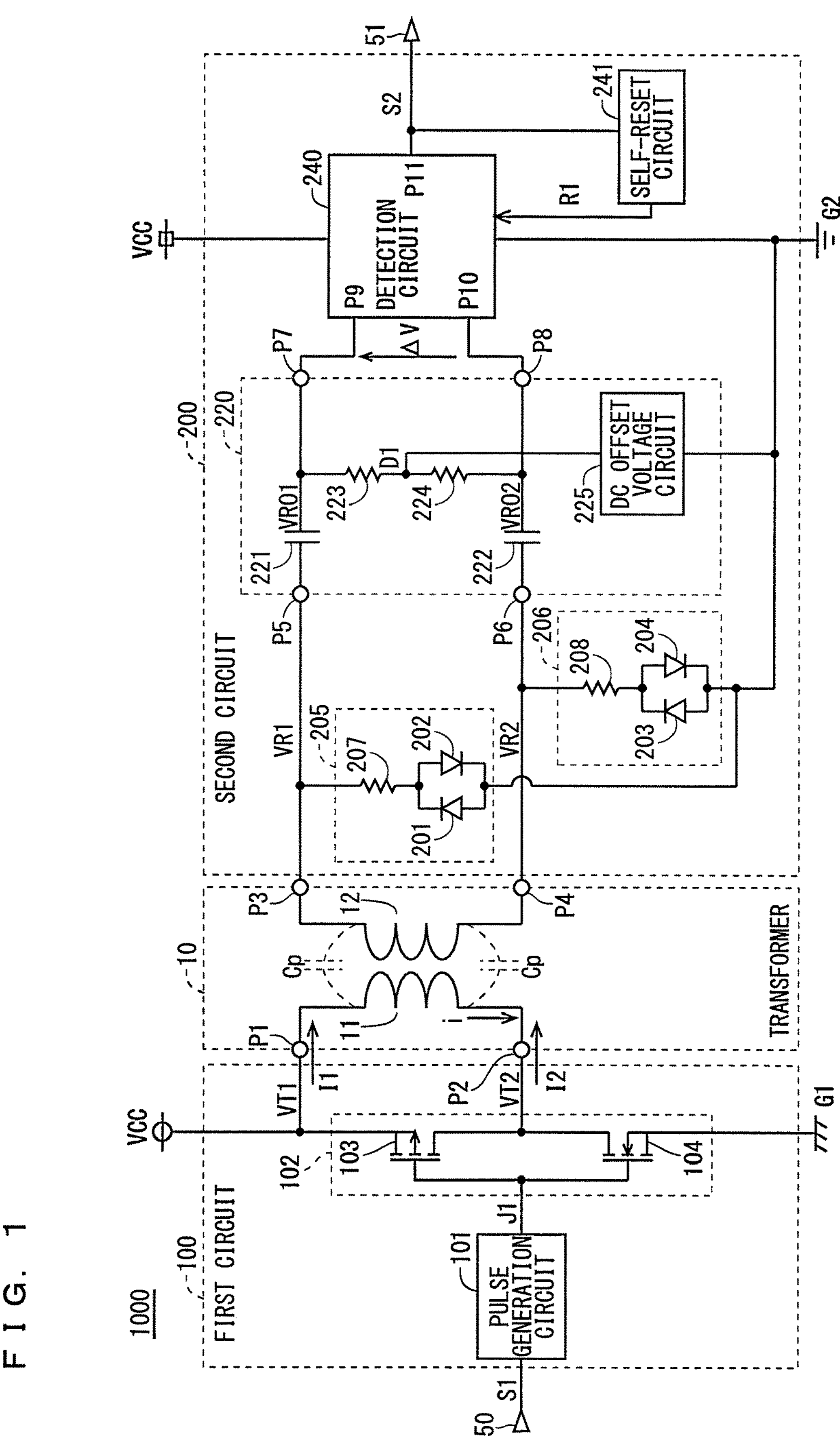
F I G. 1
1000
FIRST CIRCUIT
100
PULSE GENERATION CIRCUIT
101
S1
50
J1
102
103
104
VCC
G1
VT1
VT2
I1
I2
P1
P2
TRANSFORMER
10
11
12
Cp
Cp
i
P3
P4
SECOND CIRCUIT
200
205
206
201
202
203
204
207
208
VR1
VR2
P5
P6
220
221
222
223
224
VR01
VR02
D1
DC OFFSET VOLTAGE CIRCUIT
225
P7
P8
ΔV
P9
P10
P11
DETECTION CIRCUIT
240
VCC
R1
SELF-RESET CIRCUIT
241
S2
51
G2

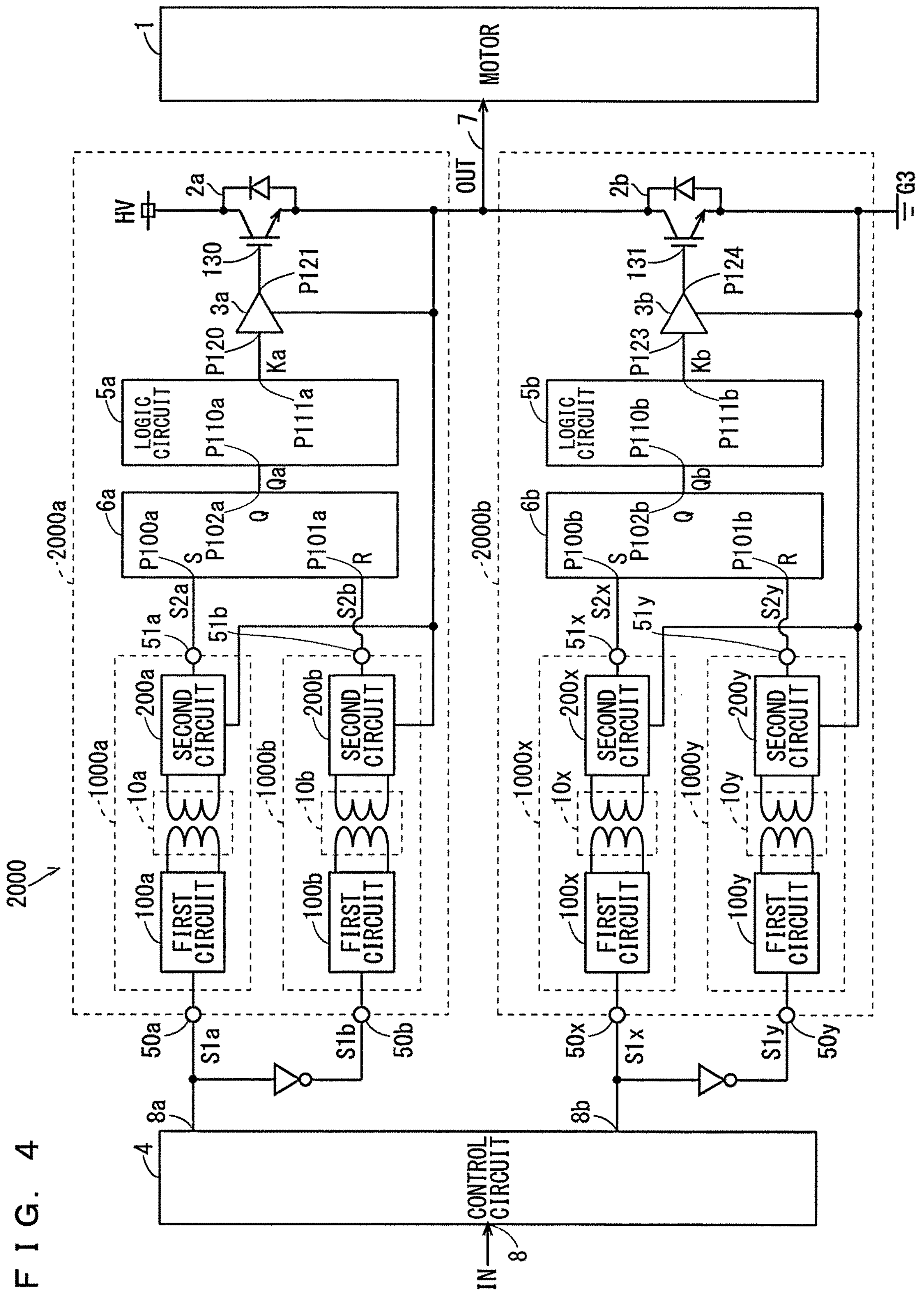
F I G. 4
MOTOR
CONTROL CIRCUIT
LOGIC CIRCUIT
FIRST CIRCUIT
SECOND CIRCUIT
IN
OUT
HV
G3

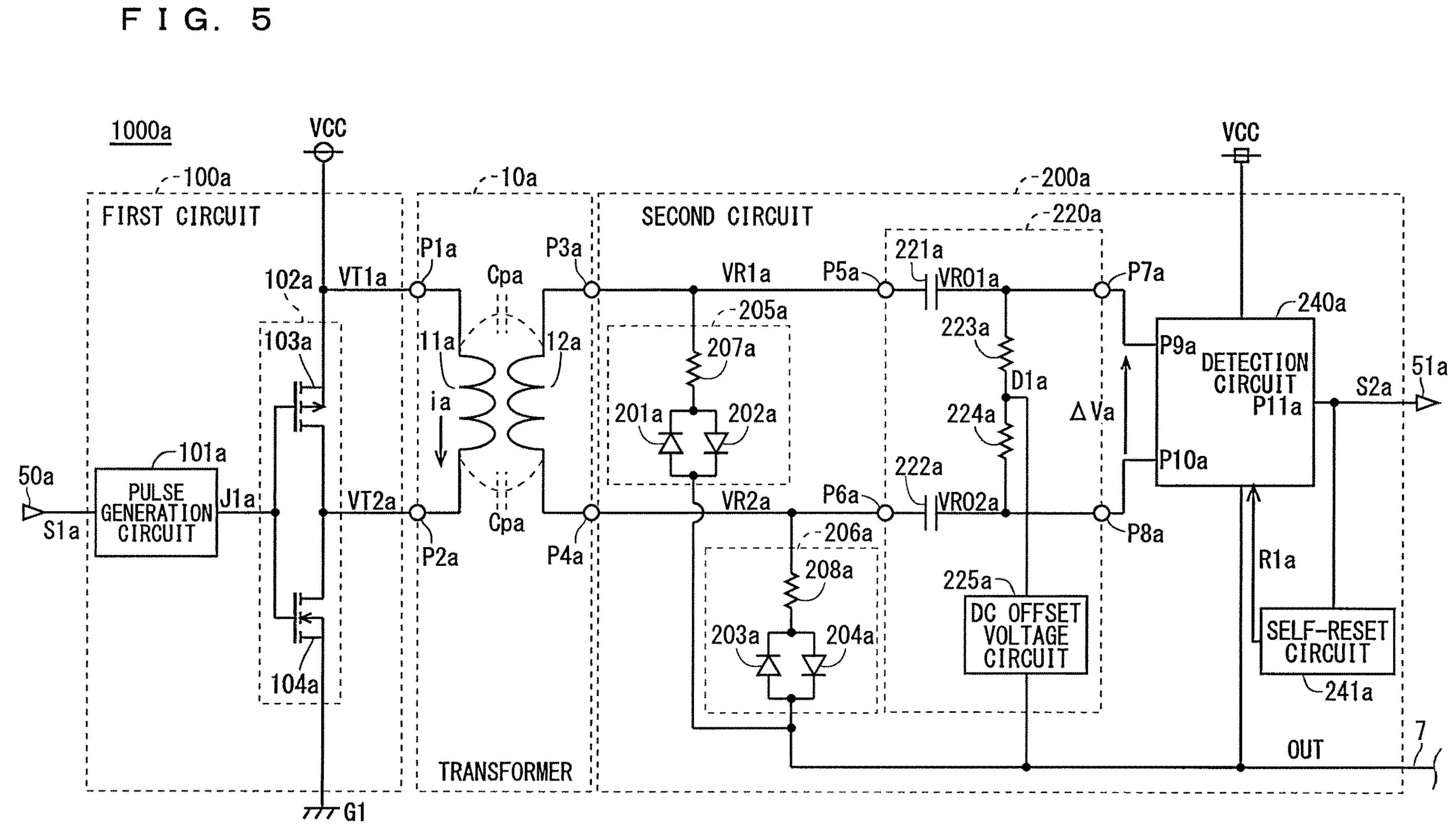
F I G. 5
1000a
FIRST CIRCUIT
100a
PULSE GENERATION CIRCUIT
101a
50a
S1a
J1a
VCC
102a
103a
104a
G1
VT1a
VT2a
P1a
P2a
11a
ia
Cpa
Cpa
12a
10a
TRANSFORMER
P3a
P4a
SECOND CIRCUIT
200a
VR1a
VR2a
205a
207a
201a
202a
206a
208a
203a
204a
P5a
P6a
220a
221a
222a
VR01a
VR02a
223a
224a
D1a
DC OFFSET VOLTAGE CIRCUIT
225a
P7a
P8a
ΔVa
P9a
P10a
DETECTION CIRCUIT
P11a
240a
VCC
R1a
SELF-RESET CIRCUIT
241a
S2a
51a
OUT
7

1000b
100b
FIRST CIRCUIT
50b
S1b
PULSE GENERATION CIRCUIT
101b
J1b
VCC
102b
VT1b
103b
VT2b
104b
G1
10b
P1b
P2b
11b
12b
ib
Cpb
Cpb
P3b
P4b
TRANSFORMER
200b
SECOND CIRCUIT
VR1b
VR2b
205b
207b
201b
202b
206b
208b
203b
204b
P5b
P6b
220b
221b
VR01b
222b
VR02b
223b
D1b
224b
225b
DC OFFSET VOLTAGE CIRCUIT
P7b
P8b
ΔVb
VCC
240b
P9b
DETECTION CIRCUIT
P11b
P10b
R1b
SELF-RESET CIRCUIT
241b
S2b
51b
OUT
7

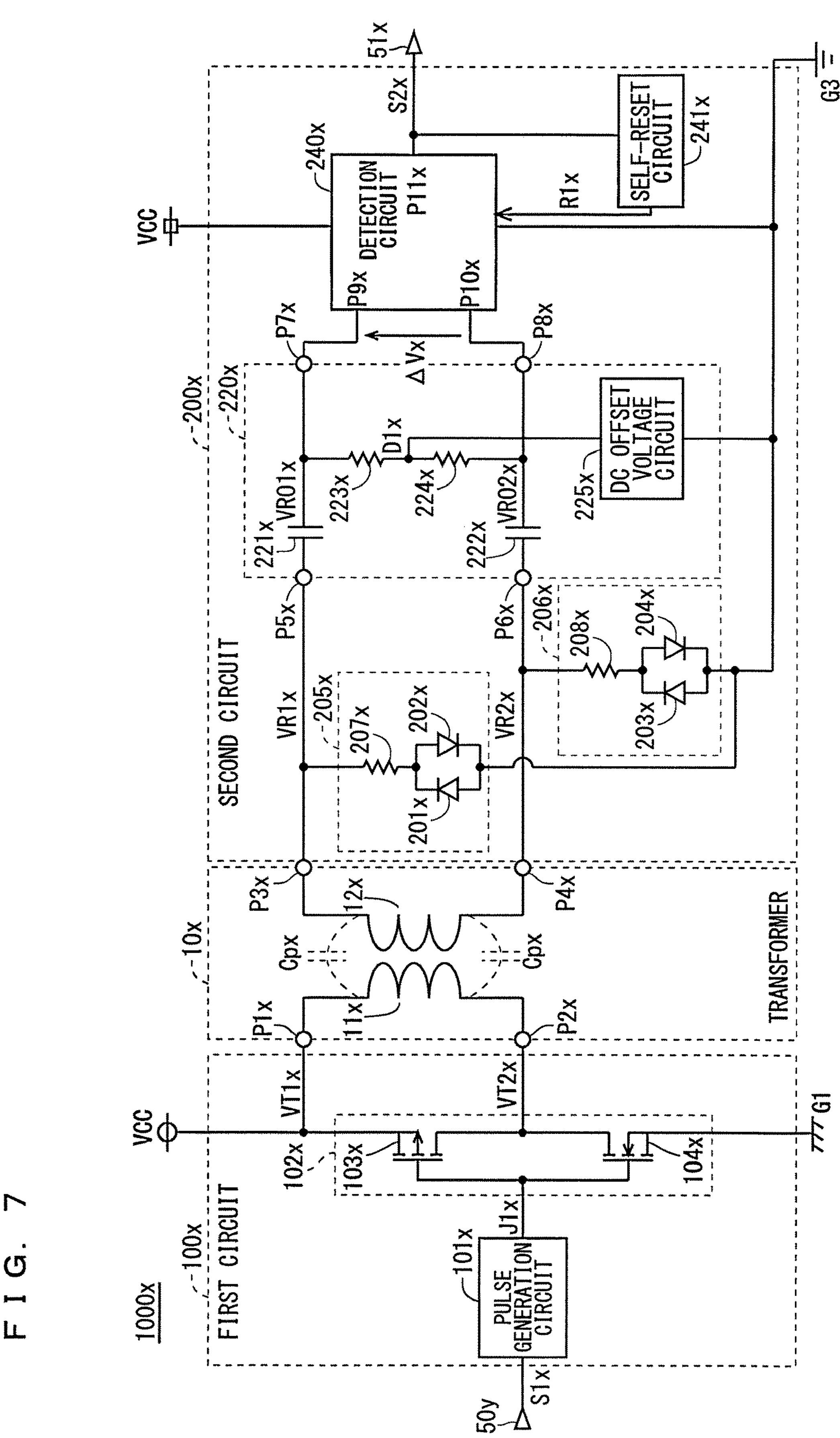
F I G. 7
1000x
100x
FIRST CIRCUIT
101x
PULSE GENERATION CIRCUIT
50y
S1x
J1x
102x
103x
104x
VCC
G1
VT1x
VT2x
P1x
P2x
10x
11x
12x
Cpx
Cpx
TRANSFORMER
P3x
P4x
200x
SECOND CIRCUIT
205x
207x
202x
201x
VR1x
VR2x
206x
208x
204x
203x
P5x
P6x
220x
221x
222x
VR01x
VR02x
223x
224x
D1x
225x
DC OFFSET VOLTAGE CIRCUIT
P7x
P8x
ΔVx
P9x
P10x
240x
DETECTION CIRCUIT
P11x
VCC
R1x
SELF-RESET CIRCUIT
241x
S2x
51x
G3

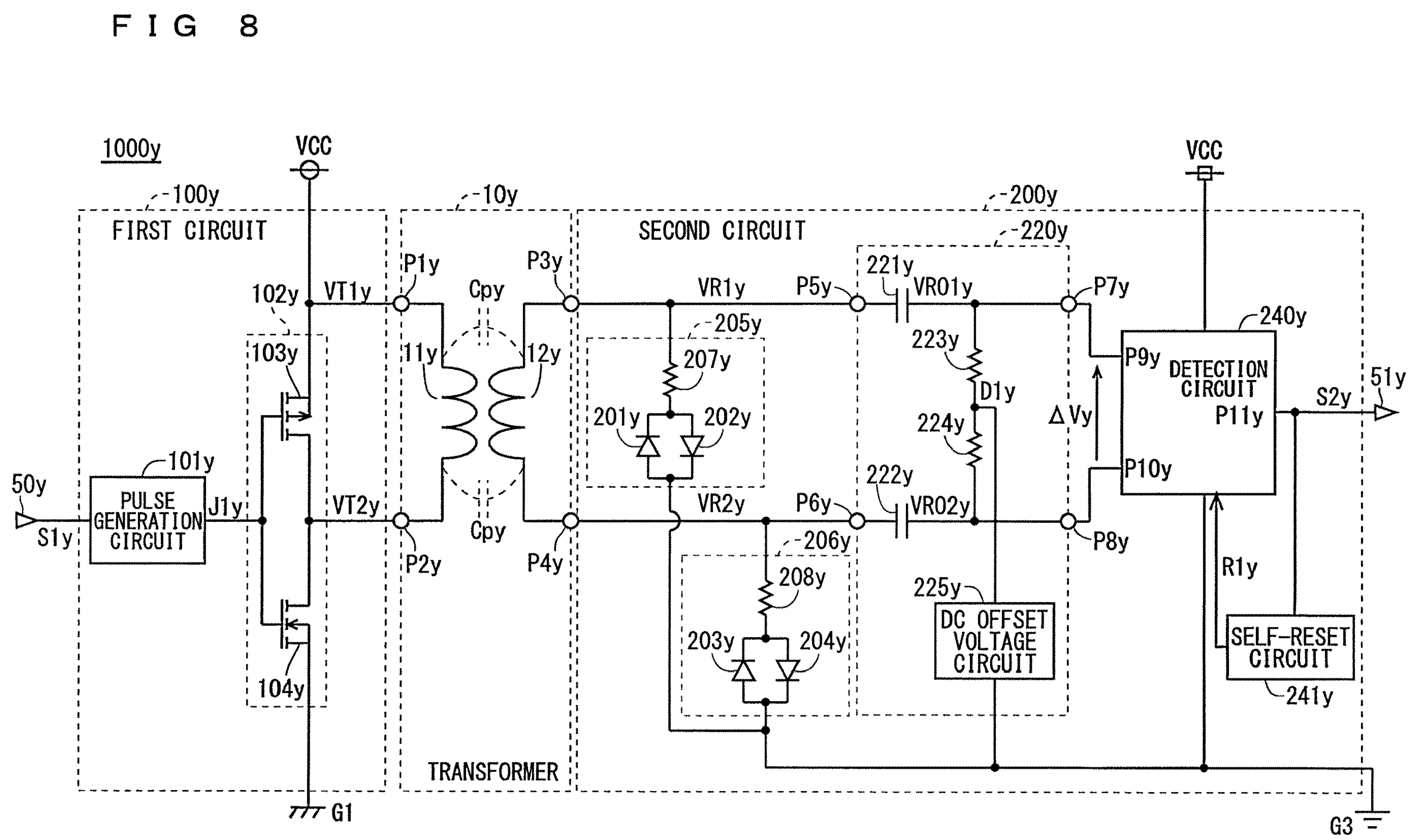
F I G 8
1000y
FIRST CIRCUIT
100y
PULSE GENERATION CIRCUIT
101y
50y
S1y
J1y
VCC
102y
103y
104y
G1
VT1y
VT2y
P1y
P2y
11y
12y
Cpy
Cpy
10y
TRANSFORMER
P3y
P4y
SECOND CIRCUIT
200y
VR1y
VR2y
205y
207y
201y
202y
206y
208y
203y
204y
P5y
P6y
221y
222y
VR01y
VR02y
223y
224y
D1y
DC OFFSET VOLTAGE CIRCUIT
225y
220y
P7y
P8y
ΔVy
P9y
P10y
DETECTION CIRCUIT
P11y
240y
VCC
R1y
SELF-RESET CIRCUIT
241y
S2y
51y
G3

IN, S1a
"H"
"L"
Vdif
0V
J1a, VT2a
VR1a
G2
VR2a
S2a
OUT
C1
C2
Ta
T1
T2
Th
t_dvdt
t_on
t_r
t_off 1000
FIRST CIRCUIT
100
PULSE GENERATION CIRCUIT
101
SECOND CIRCUIT
200
TRANSFORMER
10
DETECTION CIRCUIT
240
SELF-RESET CIRCUIT
241
DC OFFSET VOLTAGE CIRCUIT
225
VCC
G1
G2
S1
S2
R1
50
51
P1
P2
P3
P4
P5
P6
P7
P8
P9
P10
P11
VT1
VT2
VR1
VR2
VR01
VR02
D1
J1
Cp
11
12
102
103
104
105
201
202
203
204
205
206
207
208
220
221
222
223
224

Figure 1:
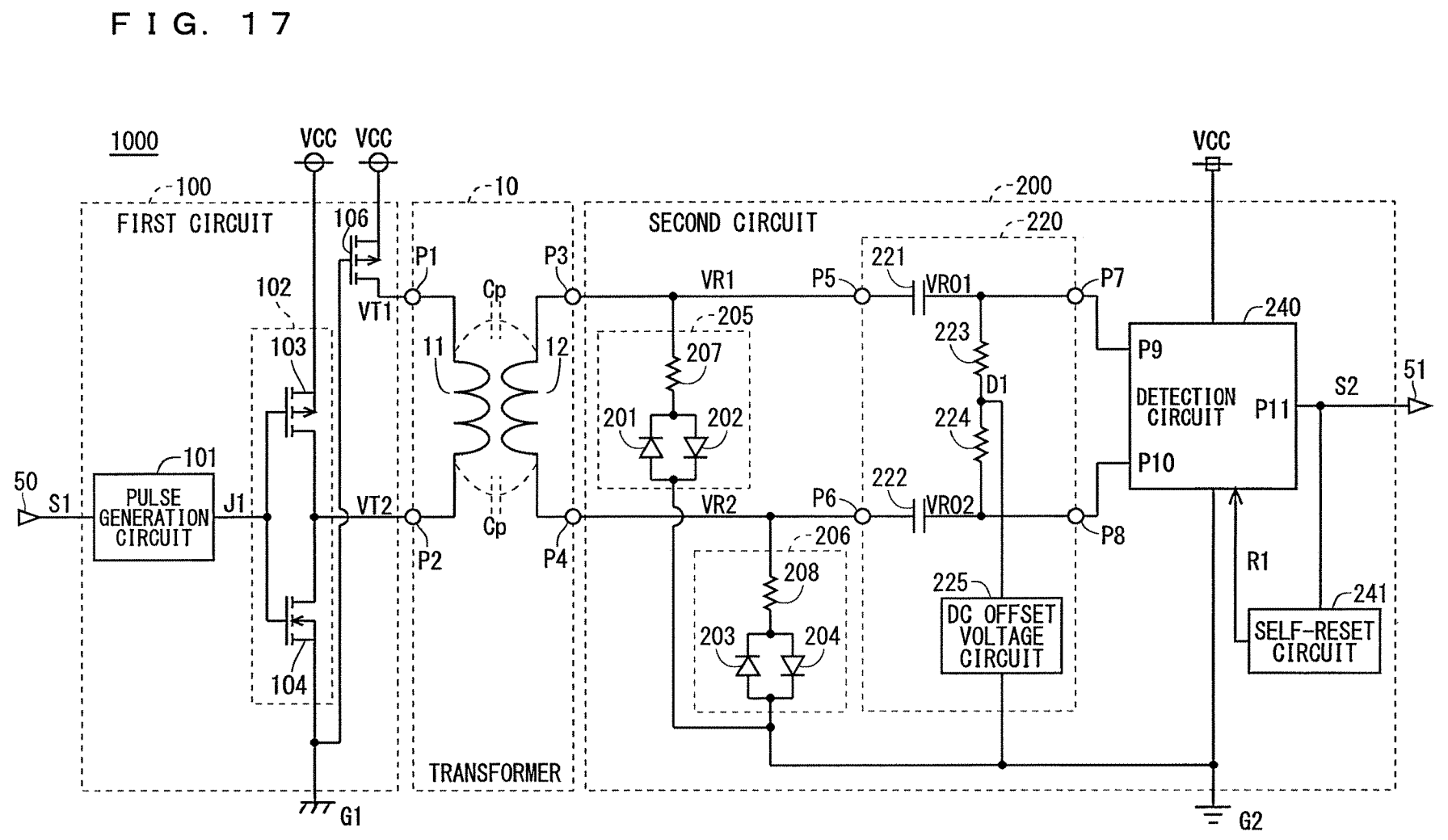

F I G. 1 7

1000

FIRST CIRCUIT 100
PULSE GENERATION CIRCUIT 101
102 103 104 106
S1 50 J1 VCC VCC G1 VT1 VT2
P1 P2 P3 P4
TRANSFORMER 10
11 12 Cp Cp
SECOND CIRCUIT 200
205 206 201 202 203 204 207 208
VR1 VR2 P5 P6
220 221 222 223 224 D1
VR01 VR02
DC OFFSET VOLTAGE CIRCUIT 225
P7 P8 P9 P10 P11
DETECTION CIRCUIT 240
VCC G2 R1
SELF-RESET CIRCUIT 241
S2 51

SIGNAL TRANSMISSION CIRCUIT AND POWER CONVERSION APPARATUS

BACKGROUND OF THE INVENTION

Field of the Invention

The present disclosure relates to a signal transmission circuit and a power conversion apparatus.

Description of the Background Art

The signal transmission circuit disclosed in WO 2018/066165 A includes a transformer including a first coil and a second coil, a first circuit connected to the first coil, and a second circuit connected to the second coil. A first signal is input to the first circuit. A second signal is output from the second circuit.

The second circuit includes a detection circuit, two rectifier circuits, a control circuit, and two output resistors. The detection circuit detects the voltage signal generated at each of both ends of the second coil and generates and outputs a second signal based on the voltage signal. The control circuit controls control voltages applied to the two rectifier circuits and controls bias voltages respectively sent to the rectifier circuits via the output resistors.

The power conversion apparatus disclosed in WO 2018/066165 A includes two signal transmission circuits, each described above, two switching elements, and two driver units. The second circuit of each signal transmission circuit is connected to an input terminal of a corresponding one of the driver units. An output terminal of each driver unit is connected to an input terminal of a corresponding one of the switching elements.

The voltage across the two ends of the second coil varies due to, for example, the opening and closing of the switching element. The suppression of the variation of the voltage at the two ends of the second coil contributes to the suppression of a malfunction of the detection circuit connected to the second coil, and eventually, the suppression of a malfunction of the opening and closing of the switching element.

In order to suppress the variation of the voltage at both ends of the second coil and eventually suppress the malfunction of the second circuit, the control voltage and the bias voltage provided to the two rectifier circuits are controlled. When the temporal change amount of potential due to the opening and closing of the switching element is significant, an event in which the opening and closing of the switching element cannot prevent the malfunction of the second circuit is assumed. It is desirable to suppress the occurrence of such an event from the viewpoint of suppressing the second signal from reflecting the first signal in the signal transmission circuit and eventually suppressing the malfunction of the opening and closing of the switching element in the power conversion apparatus.

SUMMARY

An object of a signal transmission circuit according to the present disclosure is to appropriately transmit a signal. An object of a power conversion apparatus according to the present disclosure is to suppress the malfunction of the switching element.

A signal transmission circuit according to the present disclosure includes a first circuit, to which a first signal is input, configured to generate a transmission signal according to a change in a logical value of the first signal, and use a first potential as a reference for an operation, a transformer including a first coil to which the transmission signal is input from the first circuit and a second coil inductively coupled to the first coil and configured to output a pair of reception signals, and a second circuit, to which the pair of reception signals are input from the second coil, configured to generate a second signal by performing comparison with hysteresis with respect to a potential difference between the pair of reception signals, and use a second potential as a reference for an operation. The second circuit includes a detection circuit configured to perform the comparison and output a result of detecting whether the potential difference exceeds a predetermined range as the second signal, and a reset circuit configured to reset an operation of the detection circuit when a logical value of the second signal is maintained in a preset period.

According to the signal transmission circuit according to the present disclosure, a signal is appropriately transmitted.

A power conversion apparatus according to the present disclosure includes an output line, a first switching element having one end to which a fixed potential is applied and the other end connected to the output line, a second switching element having one end connected to the output line and the other end to which a third potential is applied and configured to be turned on exclusively with respect to the first switching element, a first signal transmission circuit as which any one of the first to fifth aspects of the signal transmission circuit according to the present disclosure is adopted, a second signal transmission circuit as which any one of the first to fifth aspects of the signal transmission circuit according to the present disclosure is adopted, and a first latch circuit configured to output a signal for controlling whether to permit conduction of the first switching element, be set by the second signal output from the first signal transmission circuit, and be reset by the second signal output from the second signal transmission circuit. Both the second potential in the first signal transmission circuit and the second potential in the second signal transmission circuit are the potential of the output line.

The power conversion apparatus according to the present disclosure can obtain the advantage of the signal transmission circuit signal according to the present disclosure.

These and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 1 is a circuit diagram illustrating the configuration of a signal transmission circuit 1000 according to a first preferred embodiment;

FIG. 4 is a circuit diagram illustrating the configuration of a power conversion apparatus 2000 according to a second preferred embodiment;

FIG. 5 is a circuit diagram illustrating the configuration of a signal transmission circuit 1000*a;*

FIG. 7 is a circuit diagram illustrating the configuration of a signal transmission circuit 1000*x;*

FIG. 8 is a circuit diagram illustrating the configuration of a signal transmission circuit 1000*y*;

FIG. 17 is a circuit diagram illustrating the configuration of a signal transmission circuit 1000 to which a first circuit 100 according to a fifth preferred embodiment is applied.

DESCRIPTION OF THE PREFERRED EMBODIMENTS

<1. Signal Transmission Circuit>

Figure 2:
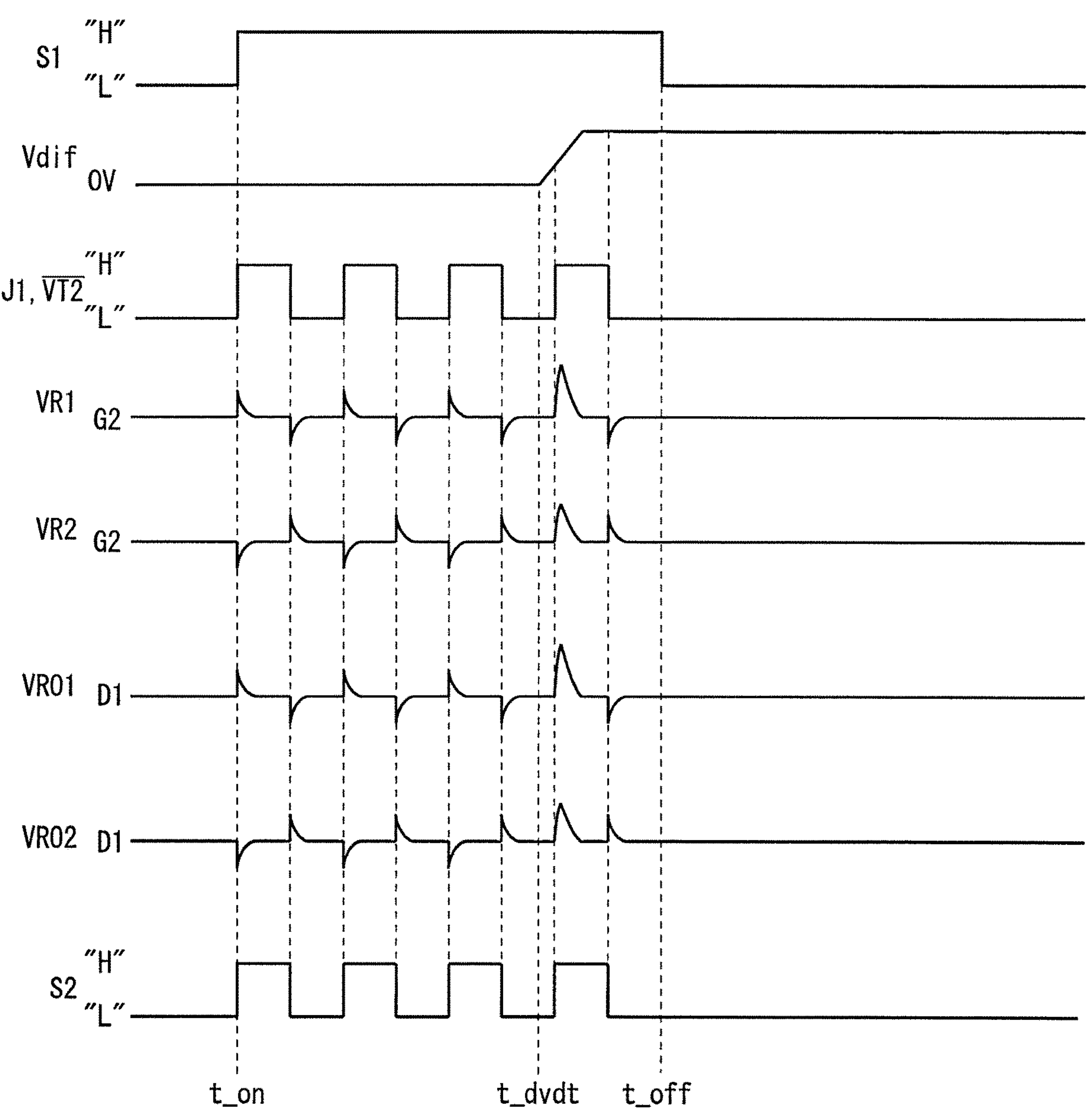
FIG. 2 is a waveform diagram illustrating temporal changes in various signals according to the first preferred embodiment.

A first preferred embodiment of the present disclosure relates to a signal transmission circuit. FIG. 1 is a circuit diagram illustrating the configuration of a signal transmission circuit 1000 according to a first preferred embodiment.

The signal transmission circuit 1000 includes an input terminal 50, a first circuit 100, a transformer 10, a second circuit 200, and an output terminal 51. The input terminal 50 may be considered to be included in the first circuit 100. It may be considered that the output terminal 51 is included in the second circuit 200.

<1-1. First Circuit 100>

The first circuit 100 includes a pulse generation circuit 101 and an output circuit 102. A first signal S1 is input to the first circuit 100 via the input terminal 50. The first signal S1 indicates two logical values. The first signal S1 ideally has a rectangular wave but may have a waveform with a gentle curve to the extent that the first signal S1 can be discriminated into two logical values by the pulse generation circuit 101.

<1-2. Pulse Generation Circuit 101>

The pulse generation circuit 101 outputs a signal J1 corresponding to a change in the value of the first signal S1. Specifically, the pulse generation circuit 101 discriminates the value of the first signal S1 into two logical values of "H" and "L". The pulse generation circuit 101 outputs a train of a plurality of pulses (to be simply referred to as a "pulse train" hereinafter) or a single pulse in the signal J1 in response to the transition of the first signal S1 from "L" to "H". The following is a case where a pulse train occurs mainly in the signal J1.

The pulse generation circuit 101 stops outputting a pulse train in the signal J1 in response to the transition of the first signal S1 from "H" to "L". The pulse generation circuit 101 is implemented by, for example, a multivibrator.

The so-called pulse width of a pulse in the signal J1, the length of a period during which the pulse takes "H", has a specified value. The specified value is shorter than a period assumed as the interval between the adjacent transitions of the two logical values of the first signal S1 in opposite directions. The pulse train continues to be generated in response to the transition of the first signal S1 from "L" to "H", and the generation of the pulse train is stopped in response to the transition of the first signal S1 from "H" to "L".

<1-3. Output Circuit 102>

The output circuit 102 receives the signal J1 and outputs a transmission signal VT2 reflecting the signal J1. Since the output circuit 102 is a component of the first circuit 100 together with the pulse generation circuit 101, it can be said that the transmission signal VT2 is a signal corresponding to the waveform of the first signal S1 generated by the first circuit 100 and input to the first circuit 100, specifically, a change in the logical value of the first signal S1.

For example, the output circuit 102 is implemented by an inverter having field effect transistors (to be also simply referred to as "transistors" hereinafter) 103 and 104. For example, a P-channel transistor is adopted as the transistor 103, and for example, an N-channel transistor is adopted as the transistor 104.

Transistor 103 has a gate, a source, and a drain. It can be said that the source and the drain are a first electrode and a second electrode that are electrically connected to each other via a signal applied to the gate. It can be said that the gate is a third electrode that controls conduction between the first electrode and the second electrode. Similarly, the transistor 104 has a source as a first electrode, a drain as a second electrode, and a gate as a third electrode.

The signal J1 is applied to both the gate of the transistor 103 and the gate of the transistor 104. The drain of the transistor 103 and the drain of the transistor 104 are connected to each other, and the potential of these drains is output as the transmission signal VT2 from the output circuit 102 and eventually from the first circuit 100. A potential G1 is a reference for the potential of these drains. Specifically, the potential G1 of the first circuit 100 is applied to the source of the transistor 104, and a fixed potential VCC higher than the potential G1 is applied to the source of the transistor 103. In this manner, the potential G1 is a reference for the operation of the first circuit 100. A potential VT1 of the source of the transistor 103 is output from the output circuit 102 and eventually from the first circuit 100.

The transformer 10 includes a first coil 11 and a second coil 12. The first coil 11 and the second coil 12 are inductively coupled. The transformer 10 has a first end P1, a second end P2, a third end P3, and a fourth end P4. One end of the first coil 11 is connected to the first end P1, and the other end is connected to the second end P2. One end of the second coil 12 is connected to the third end P3, and the other end is connected to the fourth end P4. Parasitic capacitances Cp exist between the first end P1 side of the first coil 11 and the third end P3 side of the second coil 12 and between the second end P2 side of the first coil 11 and the fourth end P4 side of the second coil 12.

The source of the transistor 103 is connected to the first end P1, to which the potential VT1 is input from the first circuit 100. The drain of the transistor 103 and the drain of the transistor 104 are connected to the second end P2, to which the transmission signal VT2 is input from the first circuit 100.

When a pulse rises in the signal J1, the transistor 103 transitions from the ON state to the OFF state, and the transistor 104 transitions from the OFF state to the ON state. The potential VT1 is output from the first circuit 100, and the potential G1 is output as the transmission signal VT2. A current from the first end P1 to the second end P2 flows through the first coil 11. Due to an increase in current when the current starts to flow, the potential of the third end P3 increases and the potential of the fourth end P4 decreases so as to prevent the increase.

When a pulse falls in the signal J1, the transistor 103 transitions from the OFF state to the ON state, and the transistor 104 transitions from the ON state to the OFF state. Both ends of the first coil 11 are short-circuited via the transistor 103 in the first circuit 100, and a current flowing through the first coil 11 decreases. Due to the reduction, the potential of the third end P3 decreases and the potential of the fourth end P4 increases so as to prevent the reduction.

The potential of the third end P3 is input to the second circuit 200 as a reception signal VR1. The potential of the fourth end P4 is input to the second circuit 200 as a reception signal VR2. The second coil 12 outputs the pair of reception signals VR1 and VR2. A reference for the potentials of the reception signals VR1 and VR2 is a potential G2 serving as a reference for the operation of the second circuit 200. The potential difference between the potentials G1 and G2 may vary.

<1-4. Second Circuit 200>

The second circuit 200 includes a detection circuit 240, an offset circuit 220, and clamp circuits 205 and 206. A potential serving as a reference for the operation of the second circuit 200 is the potential G2.

The offset circuit 220 has input terminals P5 and P6 and output terminals P7 and P8. The reception signal VR1 is provided to the input terminal P5, and the reception signal VR2 is provided to the input terminal P6. A signal VRO1 is output from the output terminal P7, and a signal VRO2 is output from the output terminal P8. The offset circuit 220 applies offset voltages to the reception signals VR1 and VR2 to generate the signals VRO1 and VRO2, respectively.

<1-5. Detection Circuit 240>

The detection circuit 240 has input ends P9 and P10 and an output end P11. The signal VRO1 is provided to the input end P9, and the signal VRO2 is provided to the input end P10. A second signal S2 is output from the output end P11. The second signal S2 is output from the output terminal 51. The detection circuit 240 operates with the potential G2 serving as a reference.

The second signal S2 takes potentials corresponding to two logical values "H" and "L" depending on the potential difference between the signals VRO1 and VRO2, specifically, a value ΔV obtained by subtracting the potential of the signal VRO2 from the potential of the signal VRO1 (to be tentatively referred to as a "subtraction voltage value" hereinafter). Specifically, the detection circuit 240 is configured to (i) raise the logical value of the second signal S2 from "L" to "H" in response to a change from a state where the subtraction voltage value ΔV is less than a positive first threshold value to a state where the subtraction voltage ΔV is equal to or more than the first threshold value, (ii) lower the logical value of the second signal S2 from "H" to "L" in response to a change from a state where the subtraction voltage value ΔV is more than a negative second threshold value to a state where the subtraction voltage ΔV is equal to or less than the second threshold value, (iii) maintain the state of the logical value of the second signal S2 even when there is a variation in the subtraction voltage value ΔV other than those in (i) and (ii) described above, and (iv) set the logical value of the second signal S2 to "L" by resetting in preference to the operations in (i) to (iii) described above.

In view of such an operation, the signals VRO1 and VRO2 can also be considered as a pair of detection signals. The detection circuit 240 performs comparison with hysteresis between the pair of reception signals VR1 and VR2 using the first threshold and the second threshold, detects whether the potential difference between the reception signals VR1 and VR2 exceeds a predetermined range, and generates the detection result as the second signal S2.

For example, the detection circuit 240 is implemented by a hysteresis comparator or a Schmitt trigger circuit. The potentials G2 and VCC are applied to the detection circuit 240, and the potential difference between them is the operating voltage of the detection circuit 240. The potential VCC applied to the detection circuit 240 is higher than the potential G2. The potential VCC applied to the detection circuit 240 and the potential VCC applied to the output circuit 102 may be different.

<1-6. Offset Circuit 220>

The offset circuit 220 includes voltage dividing resistors 223 and 224 and capacitors 221 and 222. The voltage dividing resistor 223 and the capacitor 221 implement an RC high-pass filter and bring about the effect of removing noise of a low-frequency component and a DC component of the reception signal VR1. The voltage dividing resistor 224 and the capacitor 222 implement an RC high-pass filter and bring about the effect of removing noise of a low-frequency component and a DC component of the reception signal VR2.

Specifically, the capacitor 221 is connected between the input terminal P5 and the output terminal P7, and the capacitor 222 is connected between the input terminal P6 and the output terminal P8. One end of the voltage dividing resistor 223 is connected to the output terminal P7. One end of the voltage dividing resistor 224 is connected to the output terminal P8. The other end of the voltage dividing resistor 223 and the other end of the voltage dividing resistor 224 are, for example, connected, and a DC voltage D1 with reference to the potential G2 is applied as an offset voltage (which can also be regarded as a bias voltage) to both the ends.

Since the DC voltage D1 is applied as an offset voltage to both the reception signals VR1 and VR2 to generate the signals VRO1 and VRO2, the subtraction voltage value ΔV can be considered as the potential difference between the reception signals VR1 and VR2, specifically, the value obtained by subtracting the potential of the reception signal VR2 from the potential of the reception signal VR1. From this viewpoint, it can be considered that the second circuit 200 performs comparison with hysteresis with respect to the potential difference between the pair of reception signals VR1 and VR2 and generates the second signal S2 as a result of the comparison.

Performing the comparison by the detection circuit 240 on the basis of the pair of signals VRO1 and VRO2 contributes to reducing the influence of variation in the potential G2 and eventually the influence of a voltage variation Vdif (to be described later) as compared with the case of performing the comparison on the basis of the pair of reception signals VR1 and VR2.

For example, the offset circuit 220 includes a DC offset voltage circuit 225. The DC offset voltage circuit 225 outputs the DC voltage D1 with reference to the potential G2. The DC offset voltage circuit 225 is implemented by, for example, a known DC voltage source. The DC offset voltage circuit 225 may be provided outside the offset circuit 220.

For example, the DC voltage D1 is set to, for example, a median value in a voltage range (to be temporarily referred to as an "appropriate voltage range" hereinafter) at the input ends P9 and P10 in which the detection circuit 240 can appropriately perform the above operation. Alternatively, the DC voltage D1 may be set according to the characteristics of the reception signals VR1 and VR2 or the performance of the detection circuit 240.

Assume that the appropriate voltage range is 0 V to 5 V with reference to the potential G2, the maximum value of the reception signal VR1 is 1 V, and the minimum value of the reception signal VR2 is −1 V. In this case, 2.5 V is adopted as the DC voltage D1. Adopting this voltage will make the maximum value of the signal VRO1 become 3.5 V and can obtain a margin of 1.5 (=5-3.5) V at the upper limit of the appropriate voltage range. Adopting the above voltage will make the minimum value of the signal VRO2 become 1.5 V and can obtain a margin of 1.5 (=1.5-0) V at the lower limit of the appropriate voltage range.

Assume that the appropriate voltage range is 0 V to 5 V with reference to the potential G2, the maximum value of the reception signal VR1 is 1.2 V, and the minimum value of the reception signal VR2 is −0.8 V. In this case, 2.3 V is adopted as the DC voltage D1. By adopting this voltage, a margin of 1.5 V is obtained at both the upper limit and the lower limit of the appropriate voltage range.

Assume that the appropriate voltage range is 1 V to 5 V with reference to the potential G2, the maximum value of the reception signal VR1 is 1 V, and the minimum value of the reception signal VR2 is −1 V. In this case, 3 V is adopted as the DC voltage D1. By adopting this voltage, a margin of 1 V is obtained at both the upper limit and the lower limit of the appropriate voltage range.

The voltage dividing resistors 223 and 224 and the transformer 10, more specifically, the voltage dividing resistors 223 and 224 and the second coil 12 are connected via the capacitors 221 and 222. Owing to the presence of the capacitors 221 and 222, variation in the reception signals VR1 and VR2 is less likely to be reduced even when the impedances of the voltage dividing resistors 223 and 224 are small, and variation in the DC voltage D1 is suppressed even when the impedances of the voltage dividing resistors 223 and 224 are large. Therefore, there is a design advantage that the design of the voltage dividing resistors 223 and 224 is facilitated.

The input impedance of the second circuit 200 can be adjusted by setting the offset circuit 220, specifically, by setting the respective impedances of the voltage dividing resistors 223 and 224 and the capacitors 221 and 222. Such adjustment contributes to increasing the potential difference between the reception signals VR1 and VR2.

For example, the potential difference between the reception signals VR1 and VR2 can be adjusted by adjusting the values of the capacitors 221 and 222 to perform impedance matching between the second circuit 200 and the transformer 10. Impedance matching contributes to an improvement in SN ratio. Also in this case, it is possible to suppress the variation in the DC voltage D1 and to obtain a design advantage.

FIG. 2 is a waveform diagram illustrating temporal changes in various signals. Specifically, FIG. 2 illustrates the respective waveforms of the logical value of the first signal S1, the logical value of the signal J1, the reception signals VR1 and VR2, the signals VRO1 and VRO2, and the logical value of the second signal S2. FIG. 2 also illustrates the waveform of the voltage variation Vdif to be described later.

The logical value of the first signal S1 transitions (rises) from "L" to "H" at time t_on. The logical value of the first signal S1 transitions (falls) from "H" to "L" at time t_off.

The signal J1 outputs a pulse train in a period in which the logical value of the first signal S1 is at "H". FIG. 2 illustrates a case where the signal J1 outputs four pulses in a period in which the logical value of the first signal S1 is at "H". Owing to the function of the output circuit 102, the logical value of the transmission signal VT2 is an inversion of the logical value of the signal J1, and the logical value of the signal J1 is an inversion of the logical value of the transmission signal VT2. FIG. 2 illustrates an inversion of the logical value of the transmission signal VT2 together with the signal J1 by adding an overbar above the symbol "VT2".

Both the reception signals VR1 and VR2 vary with reference to the potential G2. At the time when a pulse in the signal J1 rises, a current from the first end P1 toward the second end P2 starts to flow in the first coil 11. FIG. 2 illustrates the waveforms in which the reception signals VR1 and VR2 temporarily rise and fall, respectively, at this time and attenuate thereafter. At this time, a current i flowing through the first coil 11 and a mutual inductance L between the first coil 11 and the second coil 12 are introduced. The value of the reception signal VR1 is represented by $L\cdot(di/dt)$, and the value of the reception signal VR2 is represented by $-L\cdot(di/dt)$.

FIG. 2 illustrates the waveforms in which the reception signals VR1 and VR2 temporarily fall and rise, respectively, at the time when a pulse in the signal J1 falls and attenuate thereafter. The value of the reception signal VR1 at this time is represented by $-L\cdot(di/dt)$, and the value of the reception signal VR2 is represented by $L\cdot(di/dt)$.

As described above, since the value of the time derivative (di/dt) of the current i determines the reception signals VR1 and VR2, the current i functions similarly to the transmission signal VT2 in terms of responding to a change in the logical value of the first signal S1. It can be said that the first circuit 100 generates the current i according to a change in the logical value of the first signal S1 and the current i is input to the first coil 11. For example, it can also be said that the transmission signal VT2 is output as the potential of the drain of the transistor 104 from the drain, and the current i is a transmission signal output from the drain of the transistor 104 as a current flowing through the drain.

FIG. 2 illustrates the waveform in which the reception signal VR2 rises at the time when a pulse in the signal J1 rises in a period in which the voltage variation Vdif rises (hereinafter, a "rise period") and attenuates thereafter. The voltage variation Vdif indicates the voltage of the potential G1 with reference to the potential G2. Specifically, when a voltage variation amount per unit time (to be also simply referred to as a "time derivative") dv/dt is generated in the potential G2 with reference to the potential G1, the voltage determined by the product of a certain time constant and the time derivative dv/dt corresponds to the voltage variation Vdif. The time constant is the product of the electrostatic capacitance value of the parasitic capacitance Cp and the resistance value of an equivalent resistance R^ of the second circuit 200. The equivalent resistance R^ includes the resistance components of the clamp circuits 205 and 206 and the wiring resistance of the second circuit 200.

The voltage variation Vdif with reference to the potential G2 and is in the relationship of $Vdif=-(dv/dt)\cdot Cp\cdot R\hat{}$ (where the symbol Cp represents the capacitance value of the parasitic capacitance Cp, and the symbol R^ represents the resistance value of the equivalent resistance R^) in a rise period.

When the speed at which the potential G2 decreases from the potential G1 increases, the voltage variation Vdif increases. At this time, the parasitic capacitance Cp is charged by a displacement current due to the voltage variation Vdif. FIG. 2 illustrates a state in which the voltage variation Vdif starts to rise at time t_dvdt, and the rise of the fourth pulse in the signal J1 occurs during a rise period. When a pulse rises in the signal J1 during a rise period, the amount by which the reception signal VR1 rises from the potential G2 increases, reflecting a decrease in the potential G2. The reception signal VR2 does not fall from the potential G2 and rises from the potential G2 by an amount smaller than the amount by which the reception signal VR1 rises. Alternatively, the reception signal VR2 falls from the potential G2 by a small amount as compared with a state in which the voltage variation Vdif has not increased. After a pulse rises in the signal J1, a current from the first end P1 to the second end P2 decreases, and the reception signals VR1 and VR2 attenuate and return to the potential G2.

When the time derivative dv/dt of the voltage does not occur at the potential G2, the voltage variation Vdif becomes a steady state. Therefore, at a trailing edge of the fourth pulse in the signal J1 after the voltage variation Vdif becomes the steady state, the reception signals VR1 and VR2 behave similarly to the case of the falling of the other pulses.

FIG. 2 illustrates a case where the subtraction voltage value ΔV has changed from a state of being less than the first threshold value to the first threshold value or more even during a rise period and illustrates a case where the logical value of the second signal S2 rises from "L" to "H" according to the operation (i).

The case where a pulse falls in the signal J1 during a rise period will be described later in "<1-7. Self-reset Circuit 241>".

The signals VRO1 and VRO2 have waveforms similar to the waveforms of the reception signals VR1 and VR2, respectively. Owing to the high-pass filter obtained by the capacitor 221 and the voltage dividing resistor 223 and the DC offset voltage circuit 225, the signal VRO1 exhibits a leading edge, a subsequent decay, a trailing edge, and a subsequent decay similar to the reception signal VR1 with reference to the DC voltage D1. Owing to the high-pass filter obtained by the capacitor 222 and the voltage dividing resistor 224 and the DC offset voltage circuit 225, the signal VRO2 exhibits a leading edge and a subsequent decay similar to the reception signal VR2 with reference to the DC voltage D1.

Since the detection circuit 240 operates as described above, a pulse train appears in the second signal S2 in correspondence with a pulse train generated in the signal J1 based on the first signal S1. The interval between adjacent transitions in the pulse train appearing in the signal J1 is equal to the interval between adjacent transitions in the pulse train appearing in the second signal S2 in correspondence with the pulse train.

<1-7. Self-reset Circuit 241>

The second circuit 200 includes a self-reset circuit 241. The second signal S2 is input to the self-reset circuit 241, and the self-reset circuit 241 outputs a reset signal R1. The reset signal R1 is input to the detection circuit 240 and causes the detection circuit 240 to reset its operation.

The self-reset circuit 241 prevents the second signal S2 from becoming "H" beyond a preset period (to be also temporarily referred to as an "allowable period" hereinafter). Specifically, the self-reset circuit 241 activates the reset signal R1 when the allowable period elapses after the logic value of the second signal S2 rises. The detection circuit 240 is reset by the activation of the reset signal R1. This resetting operation sets the logical value of the second signal S2 to "L" (see (iv) described above). The self-reset circuit 241 functions as a reset circuit that resets the operation of the detection circuit 240 in the signal transmission circuit 1000 itself when the logic value of the second signal S2, "H" in this case, is maintained in the allowable period.

The self-reset circuit 241 is implemented by, for example, a timer that starts at a leading edge of the logical value of the second signal S2 and outputs the one-pulse reset signal R1 in response to the elapse of the allowable period.

For example, the self-reset circuit 241 includes a capacitor that is charged with a constant current while a logic value of the second signal S2 is "H", and is configured to output a reset signal R1 of one pulse when a voltage charged in the capacitor exceeds a threshold value.

Figure 3:
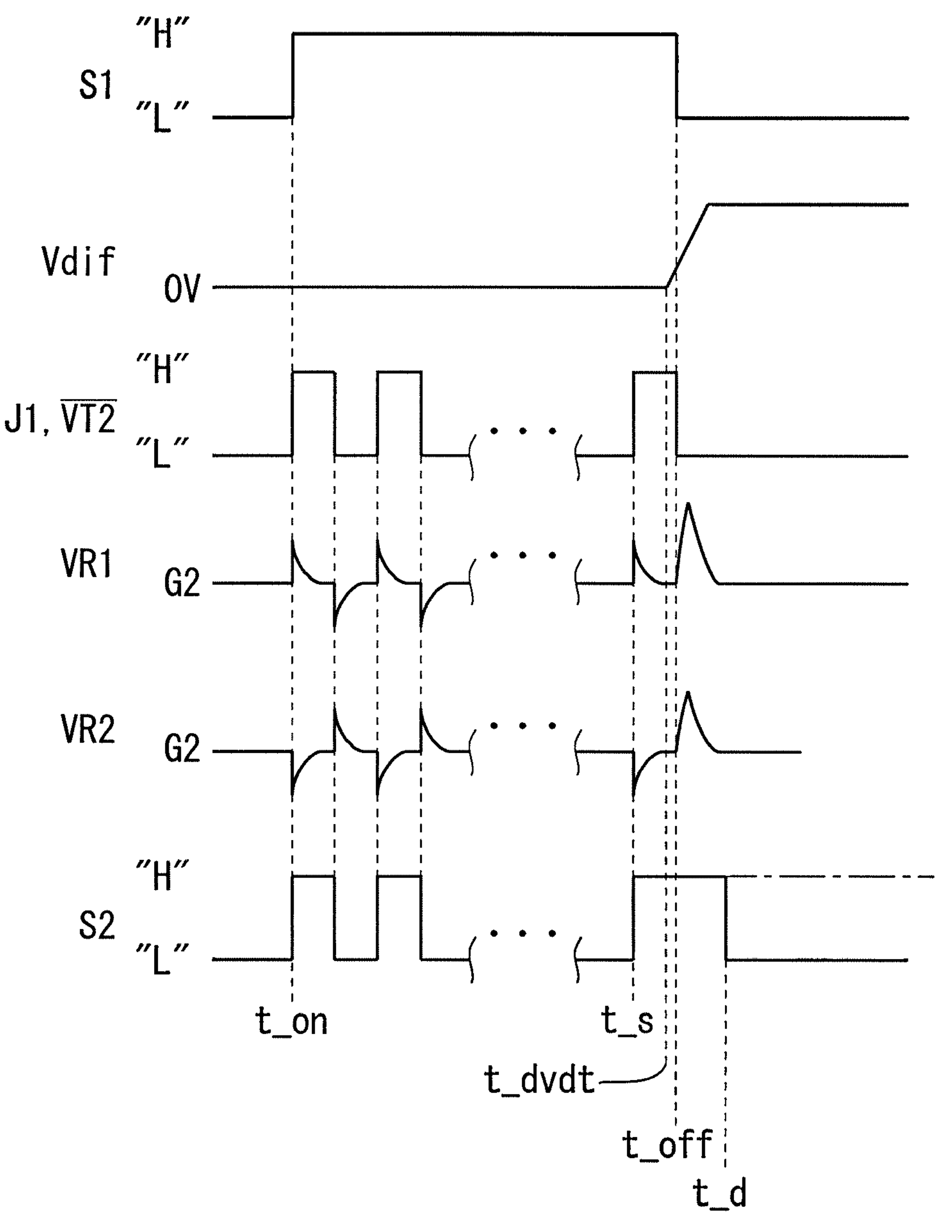
FIG. 3 is a waveform diagram for explaining the advantage of providing a self-reset circuit 241.

FIG. 3 is a waveform diagram for explaining the advantage of providing the self-reset circuit 241. FIG. 3 illustrates the respective waveforms of the logical value of the first signal S1, the logical value of the signal J1, the reception signals VR1 and VR2, and the logical value of the second signal S2. FIG. 3 also illustrates an inversion of the logical value of the transmission signal VT2 together with the signal J1 by adding an overbar above the symbol "VT2". Referring to FIG. 3, the logical value of the first signal S1 rises at time t_on and falls at time t_off.

The last pulse of the pulse train appearing in the signal J1 rises at time t_s. FIG. 3 illustrates a case where the last pulse of the pulse train appearing in the signal J1 also falls at time t_off but sometimes falls before time t_off.

FIG. 3 illustrates a case where the voltage variation Vdif is 0 V from time t_on to time t_dvdt (that is, the potential G1 is equal to the potential G2) and starts to rise from time t_dvdt.

Referring to FIG. 3, the symbol " . . . " in each of the logical value of the signal J1, the reception signals VR1 and VR2, and the logical value of the second signal S2 roughly indicates that similar waveforms are repeatedly arranged.

Unlike FIG. 2, the voltage variation Vdif increases from time t_dvdt before the last pulse of the pulse train of the signal J1 falls. As described above, during a rise period, the potential G2 is lower than the potential G1. Therefore, the reception signal VR1 rises without falling in correspondence with the fall. As a result, the potential difference between the reception signals VR1 and VR2 is smaller than the potential difference when the pulse in the signal J1 falls when the voltage variation Vdif is steady. As a result, the potential difference between the signals VRO1 and VRO2 is also small (not illustrated in FIG. 3), and hence the detection circuit 240 sometimes does not perform the above operation "(ii) lower the logical value of the second signal S2 from "H" to "L" in response to a change from a state where the subtraction voltage value ΔV is more than a negative second threshold value to a state where the subtraction voltage ΔV is equal to or less than the second threshold value". Owing to such a malfunction, the logical value of the second signal S2 rises to "H" at time t_s and then maintains "H" even after time t_off (see the chain lines). A phenomenon in which the logical value of the second signal S2 maintains "H" for a period longer than that of "H" of the signal J1 owing to such a malfunction is referred to as "high latch" below for convenience.

The self-reset circuit 241 implements the above operation "(iv) set the logical value of the second signal S2 to "L" by resetting in preference to the operations in (i) to (iii) described above" in the detection circuit 240, thereby contributing to a reduction in high latch. FIG. 3 illustrates a case where the logical value of the second signal S2 becomes "L" at time t_d by resetting. In this case, the time interval from time t_s to time t_d corresponds to the allowable period. Such a reduction in high latch contributes to the second signal S2 appropriately reflecting the signal J1 and eventually to appropriately transmitting the first signal S1 to the second signal S2.

The allowable period is preferably longer than the pulse width adopted for each pulse generated by the signal J1. This is because even if there is no malfunction, a pulse reflecting the pulse is generated in the second signal S2, and if the allowable period is equal to or less than the pulse width, a normal operation is not performed. For example, the allowable period is equal to or less than one period of a pulse in the pulse train generated by the signal J1.

<1-8. Clamp Circuits 205 and 206>

The clamp circuits 205 and 206 are connected in series between the input terminals P5 and P6. The potential G2 is applied to a connection point between the clamp circuits 205 and 206. The clamp circuit 205 is disposed closer to the input terminal P5 than the clamp circuit 206.

The clamp circuit 205 specifically includes, for example, diodes 201 and 202 and a resistor 207. In the clamp circuit 205, the diode 201 and the resistor 207 are connected in series. In the clamp circuit 205, the diode 202 and the resistor 207 are connected in series. The diodes 201 and 202 are connected in parallel with their forward directions reversed. The diode 202 is connected in parallel with the diode 201, and the forward direction thereof is opposite to the forward direction of the diode 201.

FIG. 1 illustrates a case where the forward direction of the diode 201 is a direction from the clamp circuit 206 toward the input terminal P5, and the forward direction of the diode 202 is a direction from the input terminal P5 toward the clamp circuit 206. For example, both the cathode of the diode 201 and the anode of the diode 202 are connected to the input terminal P5 via the resistor 207, and the potential G2 is applied to both the anode of the diode 201 and the cathode of the diode 202.

A current flowing through the parasitic capacitance Cp between the first end P1 side of the first coil 11 and the third end P3 side of the second coil 12 passes through the clamp circuit 205. The clamp circuit 205 contributes to the suppression of charging and discharging of the parasitic capacitance Cp. This suppression imposes limitations on an increase and a decrease in the potential of the third end P3 (which can also be said to be the potential taken by the reception signal VR1).

The clamp circuit 206 specifically includes, for example, diodes 203 and 204 and a resistor 208. In the clamp circuit 206, the diode 203 and the resistor 208 are connected in series. In the clamp circuit 206, the diode 204 and the resistor 208 are connected in series. The diodes 203 and 204 are connected in parallel with their forward directions reversed. The diode 204 is connected in parallel with the diode 203, and the forward direction thereof is opposite to the forward direction of the diode 203.

FIG. 1 illustrates a case where the forward direction of the diode 203 is a direction from the clamp circuit 205 toward the input terminal P6, and the forward direction of the diode 204 is a direction from the input terminal P6 toward the clamp circuit 205. For example, both the cathode of the diode 203 and the anode of the diode 204 are connected to the input terminal P6 via the resistor 208, and the potential G2 is applied to both the anode of the diode 203 and the cathode of the diode 204.

A current flowing through the parasitic capacitance Cp between the second end P2 side of the first coil 11 and the fourth end P4 side of the second coil 12 passes through the clamp circuit 206. The clamp circuit 206 contributes to the suppression of charging and discharging of the parasitic capacitance Cp. This suppression imposes limitations on an increase and a decrease in the potential of the fourth end P4 (which can also be said to be the potential taken by the reception signal VR2).

Either of the clamp circuits 205 and 206 contributes to a reduction in malfunction of the detection circuit 240 due to a variation in the potential difference between the potentials G1 and G2 (which can be represented by, for example, the above time derivative dv/dt).

Settings in the resistors 207 and 208 will be described in <2-6. Setting in Current Limiting Resistor> described later.

<2. Power Conversion Apparatus>

A second preferred embodiment of the present disclosure relates to a power conversion apparatus. FIG. 4 is a circuit diagram illustrating the configuration of a power conversion apparatus 2000 according to a second preferred embodiment.

First signals S1*a*, S1*b*, S1*x*, and S1*y* each having two logical values are input to the power conversion apparatus 2000. The power conversion apparatus 2000 outputs an output potential OUT to an external load 1 via an output line 7. The output potential OUT is the potential of the output line 7. The external load 1 is driven by the output potential OUT. The external load 1 is, for example, a motor.

An input signal IN is input to an input end 8 of a control circuit 4, the first signal S1*a* is output from an output end 8*a*, and the first signal S1*x* is output from an output end 8*b*. For example, the logical value of the first signal S1*a* is inverted by an inverter to obtain the first signal S1*b*. For example, the logical value of the first signal S1*x* is inverted by an inverter to obtain the first signal S1*y*.

A power conversion apparatus 2000 includes an upper arm circuit 2000*a* and a lower arm circuit 2000*b*. The upper arm circuit 2000*a* and the lower arm circuit 2000*b* are connected via an output line 7. It can also be seen that the output line 7 is provided in the power conversion apparatus 2000.

<2-1. Upper Arm Circuit 2000*a*>

The upper arm circuit 2000*a* includes signal transmission circuits 1000*a* and 1000*b*, a latch circuit 6*a*, a logic circuit 5*a*, a driver 3*a*, and a switching element 2*a*. For example, a power semiconductor switching element is adopted as the switching element 2*a*. For example, a reverse conducting insulated gate bipolar transistor IGBT (IGBT refers to an insulated gate bipolar transistor; the same applies hereinafter) 130 is adopted as the switching element 2*a*.

The signal transmission circuit 1000*a* includes an input terminal 50*a*, a first circuit 100*a*, a transformer 10*a*, a second circuit 200*a*, and an output terminal 51*a*. The input terminal 50*a* may be considered to be included in the first circuit 100*a*. The output terminal 51*a* may be considered to be included in the second circuit 200*a*.

The signal transmission circuit 1000*b* includes an input terminal 50*b*, a first circuit 100*b*, a transformer 10*b*, a second circuit 200*b*, and an output terminal 51*b*. The input terminal 50*b* may be considered to be included in the first circuit 100*b*. The output terminal 51*b* may be considered to be included in the second circuit 200*b*.

The first signal S1*a* is input to the input terminal 50*a*. The first signal S1*b* is input to the input terminal 50*b*. A second signal S2*a* is output from the output terminal 51*a*. A second signal S2*b* is output from the output terminal 51*b*.

The latch circuit 6*a* has a set end P100*a*, a reset end P101*a*, and an output end P102*a*. When the logical value of the signal input to the set end P100*a* takes "H", the latch circuit 6*a* is set, and a signal Qa output from the output end P102*a* takes logical value "H". When the logical value of the signal input to the reset end P101a takes "H", the latch circuit 6a is reset, and the signal Qa takes logical value "L".

The output terminal 51a is connected to the set end P100a, and the second signal S2a is input to the set end P100a. The output terminal 51b is connected to the reset end P101a, and the second signal S2b is input to the reset end P101a.

The logic circuit 5a has an input end P110a and an output end P111a. The input end P110a is connected to the output end P102a.

The driver 3a has an input end P120 and an output end P121. The input end P120 is connected to the output end P111a.

The gate of a reverse conducting IGBT 130 is connected to the output end P121. A fixed potential HV is applied to the collector of the reverse conducting IGBT 130 which is one end of the switching element 2a. The emitter of the reverse conducting IGBT 130, which is the other end of the switching element 2a, is connected to the output line 7. The gate of the reverse conducting IGBT 130 functions as an input end for driving the switching element 2a. A potential G3 serves as a reference for the potential HV. The potential G3 is, for example, a ground potential.

<2-2. Lower Arm Circuit 2000b>

The lower arm circuit 2000b includes signal transmission circuits 1000x and 1000y, a latch circuit 6b, a logic circuit 5b, a driver 3b, and a switching element 2b. For example, a power semiconductor switching element is adopted as the switching element 2b. For example, a reverse conducting IGBT 131 is adopted as the switching element 2b. A field effect transistor may be employed for either or both of the switching elements 2a and 2b.

The signal transmission circuit 1000x includes an input terminal 50x, a first circuit 100x, a transformer 10x, a second circuit 200x, and an output terminal 51x. The input terminal 50x may be considered to be included in the first circuit 100x. The output terminal 51x may be considered to be included in the second circuit 200x.

The signal transmission circuit 1000y includes an input terminal 50y, a first circuit 100y, a transformer 10y, a second circuit 200y, and an output terminal 51y. The input terminal 50y may be considered to be included in the first circuit 100y. The output terminal 51y may be considered to be included in the second circuit 200y.

The first signal S1x is input to the input terminal 50x. The first signal S1y is input to the input terminal 50y. The second signal S2x is output from the output terminal 51x. The second signal S2y is output from the output terminal 51y.

The latch circuit 6b has a set end P100b, a reset end P101b, and an output end P102b. When the logical value of the signal input to the set end P100b takes "H", the latch circuit 6b is set, and a signal Qb output from the output end P102b takes logical value "H". When the logical value of the signal input to the reset end P101b takes "H", the latch circuit 6b is reset, and the signal Qb takes logical value "L".

The output terminal 51x is connected to the set end P100b, and the second signal S2x is input to the set end P100b. The output terminal 51y is connected to the reset end P101b, and the second signal S2y is input to the reset end P101b.

The logic circuit 5b has an input end P110b and an output end P111b. The input end P110b is connected to the output end P102b.

The driver 3b has an input end P123 and an output end P124. The input end P123 is connected to the output end P111b.

The gate of the reverse conducting IGBT 131 is connected to the output end P124. The collector of the reverse conducting IGBT 131, which is one end of the switching element 2b, is connected to the output line 7. The potential G3 is applied to the emitter of the reverse conducting IGBT 131, which is the other end of the switching element 2b. The gate of the reverse conducting IGBT 131 functions as an input end for driving the switching element 2b.

<2-3. Signal Transmission Circuits 1000a, 1000b, 1000x, and 1000y>

Each of the signal transmission circuits 1000a, 1000b, 1000x, and 1000y according to the second preferred embodiment adopts, for example, the configuration of the signal transmission circuit 1000 according to the first preferred embodiment. The power conversion apparatus 2000 according to the second preferred embodiment can obtain the advantage of the signal transmission circuit 1000.

Figure 6:
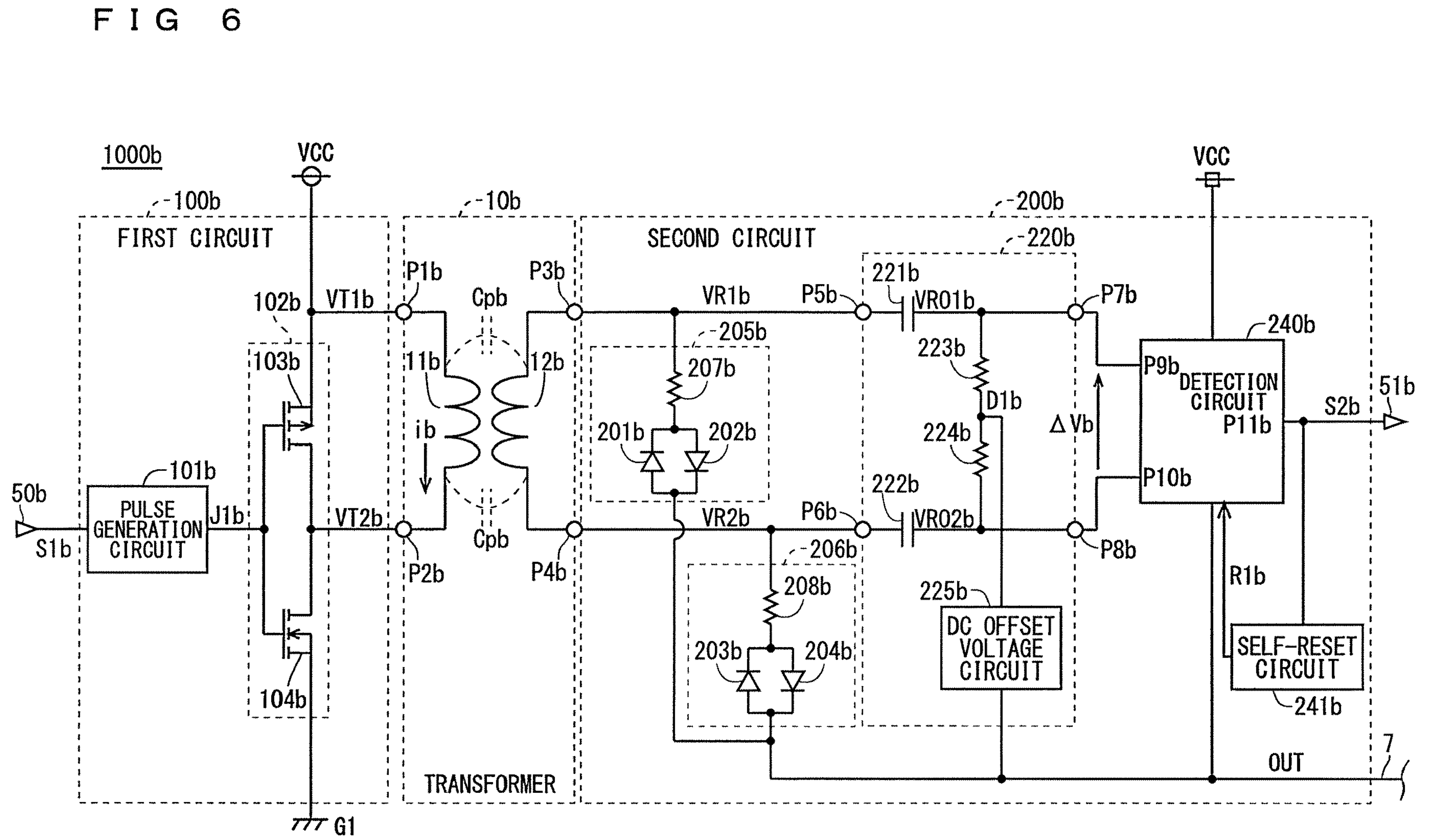
FIG. 6 is a circuit diagram illustrating the configuration of a signal transmission circuit 1000*b;*

FIG. 5 is a circuit diagram illustrating the configuration of the signal transmission circuit 1000a. FIG. 6 is a circuit diagram illustrating the configuration of the signal transmission circuit 1000b. FIG. 7 is a circuit diagram illustrating the configuration of the signal transmission circuit 1000x. FIG. 8 is a circuit diagram illustrating the configuration of the signal transmission circuit 1000y.

The configuration of the signal transmission circuit 1000a (see FIG. 5) is the same as the signal transmission circuit 1000 (see FIG. 1) described in the first preferred embodiment except for the connection relationship with the output line 7. Specifically, the configuration and operation of the signal transmission circuit 1000a are explained by reading the first circuit 100, the pulse generation circuit 101, the output circuit 102, the transistors 103 and 104, the transformer 10, the first coil 11, the second coil 12, the input terminal 50, the output terminal 51, the second circuit 200, the diodes 201, 202, 203, and 204, the clamp circuits 205 and 206, the resistors 207 and 208, the offset circuit 220, the capacitors 221 and 222, the voltage dividing resistors 223 and 224, the DC offset voltage circuit 225, the detection circuit 240, the self-reset circuit 241, the first end P1, the second end P2, the third end P3, the fourth end P4, the input terminals P5 and P6, the output terminals P7 and P8, the input ends P9 and P10, the output end P11, the parasitic capacitance Cp, the first signal S1, the second signal S2, the signals J1, VRO1, and VRO2, the potential VT1, the transmission signal VT2, the reception signals VR1 and VR2, the DC voltage D1, the reset signal R1, and the subtraction voltage value ΔV, which are described in the first preferred embodiment, as the first circuit 100a, a pulse generation circuit 101a, an output circuit 102a, transistors 103a and 104a, the transformer 10a, a first coil 11a, a second coil 12a, the input terminal 50a, the output terminal 51a, the second circuit 200a, diodes 201a, 202a, 203a, and 204a, clamp circuits 205a and 206a, resistors 207a and 208a, an offset circuit 220a, capacitors 221a and 222a, voltage dividing resistors 223a and 224a, a DC offset voltage circuit 225a, a detection circuit 240a, a self-reset circuit 241a, a first end P1a, a second end P2a, a third end P3a, and a fourth end P4a, input terminals P5a and P6a, output terminals P7a and P8a, input ends P9a and P10a, an output end P11a, a parasitic capacitor Cpa, the first signal S1a, the second signal S2a, signals J1a, VRO1a, and VRO2a, a potential VT1a, a transmission signal VT2a, reception signals VR1a and VR2a, a DC voltage D1a, a reset signal R1a, and a subtraction voltage value ΔVa.

However, in the configuration of the signal transmission circuit 1000a, the output line 7 is connected to each of the anodes of the diodes 201a and 203a and the cathodes of the diodes 202a and 204a, and the output potential OUT is applied to each of them. The DC offset voltage circuit 225a outputs the DC voltage D1*a* with reference to the output potential OUT. The operating voltage of the detection circuit 240*a* is the potential difference between the potential VCC and the output potential OUT. The output potential OUT corresponds to the potential G2 in the first preferred embodiment.

The configuration of the signal transmission circuit 1000*b* (see FIG. 6) is the same as the configuration of the signal transmission circuit 1000*a* (see FIG. 5). Specifically, the configuration and operation of the signal transmission circuit 1000*b* are explained by reading the first circuit 100*a*, the pulse generation circuit 101*a*, the output circuit 102*a*, the transistors 103*a* and 104*a*, the transformer 10*a*, the first coil 11*a*, the second coil 12*a*, the input terminal 50*a*, the output terminal 51*a*, the second circuit 200*a*, the diodes 201*a*, 202*a*, 203*a*, and 204*a*, the clamp circuits 205*a* and 206*a*, the resistors 207*a* and 208*a*, the offset circuit 220*a*, the capacitors 221*a* and 222*a*, the voltage dividing resistors 223*a* and 224*a*, the DC offset voltage circuit 225*a*, the detection circuit 240*a*, the self-reset circuit 241*a*, the first end P1*a*, the second end P2*a*, the third end P3*a*, the fourth end P4*a*, the input terminals P5*a* and P6*a*, the output terminals P7*a* and P8*a*, the input ends P9*a* and P10*a*, the output end P11*a*, the parasitic capacitance Cpa, the first signal S1*a*, the second signal S2*a*, the signals J1*a*, VRO1*a*, and VRO2*a*, the potential VT1*a*, the transmission signal VT2*a*, the reception signals VR1*a* and VR2*a*, the DC voltage D1*a*, the reset signal R1*a*, and the subtraction voltage value ΔVa, which are included in the signal transmission circuit 1000*a*, as the first circuit 100*b*, a pulse generation circuit 101*b*, an output circuit 102*b*, transistors 103*b* and 104*b*, the transformer 10*b*, a first coil 11*b*, a second coil 12*b*, the input terminal 50*b*, the output terminal 51*b*, the second circuit 200*b*, diodes 201*b*, 202*b*, 203*b*, and 204*b*, clamp circuits 205*b* and 206*b*, resistors 207*b* and 208*b*, an offset circuit 220*b*, capacitors 221*b* and 222*b*, voltage dividing resistors 223*b* and 224*b*, a DC offset voltage circuit 225*b*, a detection circuit 240*b*, a self-reset circuit 241*b*, a first end P1*b*, a second end P2*b*, a third end P3*b*, and a fourth end P4*b*, input terminals P5*b* and P6*b*, output terminals P7*b* and P8*b*, input ends P9*b* and P10*b*, an output end P11*b*, a parasitic capacitor Cpb, the first signal S1*b*, the second signal S2*b*, signals J1*b*, VRO1*b*, and VRO2*b*, a potential VT1*b*, a transmission signal VT2*b*, reception signals VR1*b* and VR2*b*, a DC voltage Dib, a reset signal Rib, and a subtraction voltage value ΔVb.

The configuration of the signal transmission circuit 1000*x* (see FIG. 7) is the same as the signal transmission circuit 1000 (see FIG. 1) described in the first preferred embodiment except for the potentials G2 and G3. Specifically, the configuration and operation of the signal transmission circuit 1000*x* are explained by reading the first circuit 100, the pulse generation circuit 101, the output circuit 102, the transistors 103 and 104, the transformer 10, the first coil 11, the second coil 12, the input terminal 50, the output terminal 51, the second circuit 200, the diodes 201, 202, 203, and 204, the clamp circuits 205 and 206, the resistors 207 and 208, the offset circuit 220, the capacitors 221 and 222, the voltage dividing resistors 223 and 224, the DC offset voltage circuit 225, the detection circuit 240, the self-reset circuit 241, the first end P1, the second end P2, the third end P3, the fourth end P4, the input terminals P5 and P6, the output terminals P7 and P8, the input ends P9 and P10, the output end P11, the parasitic capacitance Cp, the first signal S1, the second signal S2, the signals J1, VRO1, and VRO2, the potential VT1, the transmission signal VT2, the reception signals VR1 and VR2, the DC voltage D1, the reset signal R1, the subtraction voltage value ΔV, and the potential G2, which are described in the first preferred embodiment, as the first circuit 100*x*, a pulse generation circuit 101*x*, an output circuit 102*x*, transistors 103*x* and 104*x*, the transformer 10*x*, a first coil 11*x*, a second coil 12*x*, the input terminal 50*x*, the output terminal 51*x*, the second circuit 200*x*, diodes 201*x*, 202*x*, 203*x*, and 204*x*, clamp circuits 205*x* and 206*x*, resistors 207*x* and 208*x*, an offset circuit 220*x*, capacitors 221*x* and 222*x*, voltage dividing resistors 223*x* and 224*x*, a DC offset voltage circuit 225*x*, a detection circuit 240*x*, a self-reset circuit 241*x*, a first end P1*x*, a second end P2*x*, a third end P3*x*, and a fourth end P4*x*, input terminals P5*x* and P6*x*, output terminals P7*x* and P8*x*, input ends P9*x* and P10*x*, an output end P11*x*, a parasitic capacitor Cpx, the first signal S1*x*, the second signal S2*x*, signals J1*x*, VRO1*x*, and VRO2*x*, a potential VT1*x*, a transmission signal VT2*x*, reception signals VR1*x* and VR2*x*, a DC voltage Dix, a reset signal R1*x*, a subtraction voltage value ΔVx, and the potential G3.

The configuration of the signal transmission circuit 1000*y* (see FIG. 8) is the same as the configuration of the signal transmission circuit 1000*x* (see FIG. 7). Specifically, the configuration and operation of the signal transmission circuit 1000*y* are explained by reading the first circuit 100*x*, the pulse generation circuit 101*x*, the output circuit 102*x*, the transistors 103*x* and 104*x*, the transformer 10*x*, the first coil 11*x*, the second coil 12*x*, the input terminal 50*x*, the output terminal 51*x*, the second circuit 200*x*, the diodes 201*x*, 202*x*, 203*x*, and 204*x*, the clamp circuits 205*x* and 206*x*, the resistors 207*x* and 208*x*, the offset circuit 220*x*, the capacitors 22*ix* and 222*x*, the voltage dividing resistors 223*x* and 224*x*, the DC offset voltage circuit 225*x*, the detection circuit 240*x*, the self-reset circuit 241*x*, the first end P1*x*, the second end P2*x*, the third end P3*x*, the fourth end P4*x*, the input terminals P5*x* and P6*x*, the output terminals P7*x* and P8*x*, the input ends P9*x* and P10*x*, the output end P11*x*, the parasitic capacitance Cpx, the first signal S1*x*, the second signal S2*x*, the signals J1*x*, VRO1*x*, and VRO2*x*, the potential VT1*x*, the transmission signal VT2*x*, the reception signals VR1*x* and VR2*x*, the DC voltage Dix, the reset signal Rix, and the subtraction voltage value ΔVx, which are included in the signal transmission circuit 1000*x*, as the first circuit 100*y*, a pulse generation circuit 101*y*, an output circuit 102*y*, transistors 103*y* and 104*y*, the transformer 10*y*, a first coil 11*y*, a second coil 12*y*, the input terminal 50*y*, the output terminal 51*y*, the second circuit 200*y*, diodes 201*y*, 202*y*, 203*y*, and 204*y*, clamp circuits 205*y* and 206*y*, resistors 207*y* and 208*y*, an offset circuit 220*y*, capacitors 221*y* and 222*y*, voltage dividing resistors 223*y* and 224*y*, a DC offset voltage circuit 225*y*, a detection circuit 240*y*, a self-reset circuit 241*y*, a first end P1*y*, a second end P2*y*, a third end P3*y*, and a fourth end P4*y*, input terminals P5*y* and P6*y*, output terminals P7*y* and P8*y*, input ends P9*y* and P10*y*, an output end P11*y*, a parasitic capacitor Cpy, the first signal S1*y*, the second signal S2*y*, signals J1*y*, VRO1*y*, and VRO2*y*, a potential VT1*y*, a transmission signal VT2*y*, reception signals VR1*y* and VR2*y*, a DC voltage D1*y*, a reset signal Rly, and a subtraction voltage value ΔVy.

Either of the signal transmission circuits 1000*a*, 1000*b*, 1000*x*, and 1000*y* according to the second preferred embodiment operate similarly to the signal transmission circuit 1000 according to the first preferred embodiment. However, the potential G2 in the signal transmission circuit 1000 corresponds to the output potential OUT in the signal transmission circuits 1000*a* and 1000*b*, and the potential G2 in the signal transmission circuit 1000 corresponds to the potential G3 in the signal transmission circuits 1000*x* and 1000*y*.

The potential G2 set when the signal transmission circuit 1000 is adopted as the signal transmission circuit 1000*a* is the output potential OUT. The potential G2 set when the signal transmission circuit 1000 is adopted as the signal transmission circuit 1000*b* is the output potential OUT. The potential G2 set when the signal transmission circuit 1000 is adopted as the signal transmission circuit 1000*x* is the potential G3. The potential G2 set when the signal transmission circuit 1000 is adopted as the signal transmission circuit 1000*y* is the potential G3.

For example, the input signal IN has information for driving the external load 1. The control circuit 4 generates the first signals S1*a* and S1*x* based on the input signal IN. For example, the first signals S1*a* and S1*x* exclusively take logical value "H" and are activated. The logical values of the first signals S1*b* and S1*y* are in an inverted relationship with the logical values of the first signals S1*a* and S1*x*, respectively. The following will exemplify a case where the potential corresponding to logical value "H" is higher than the potential corresponding to logical value "L".

The signal transmission circuit 1000*a* performs signal transmission via the transformer 10*a* and outputs the second signal S2*a*. The signal transmission circuit 1000*b* performs signal transmission via the transformer 10*b* and outputs the second signal S2*b*. The signal transmission circuit 1000*x* performs signal transmission via the transformer 10*x* and outputs the second signal S2*x*. The signal transmission circuit 1000*y* performs signal transmission via the transformer 10*y* and outputs the second signal S2*y*.

The second signal S2*a* is input to the set end P100*a*. The second signal S2*a* takes logical value "H", so that the signal Qa output from the output end P102*a* takes logical value "H". The second signal S2*b* is input to the reset end P101*a*. The second signal S2*b* takes logical value "H", so that the signal Qa takes logical value "L".

As described above, similar to the relationship between the signal J1 and the second signal S2 described in the first preferred embodiment (see FIG. 2), the waveform of the logical value of the second signal S2*a* indicates a pulse train reflecting the pulse train of the logical value of the signal J1*a*. Therefore, the waveform of the logical value of the second signal S2*a* does not necessarily reflect the waveform of the logical value of the first signal Sla. However, owing to the function of the latch circuit 6*a*, after the second signal S2*a* once takes logical value "H", the signal Qa continues to take logical value "H" until the second signal S2*b* takes logical value "H". Similarly, after the second signal S2*b* once takes logical value "H", the signal Qa continues to take logical value "L" until the second signal S2*a* takes logical value "H". Since the logical value of the second signal S2*b* and the logical value of the second signal S2*a* are in an inverted relationship, the signal Qa takes a logical value reflecting the logical value of the first signal Sla.

Similar to the first signal S1*a*, the signal Qa functions as a drive-on signal that permits the switching element 2*a* to be turned on. Similarly to the first signal S1*b*, the signal Qa also functions as a drive-off signal that prohibits the switching element 2*a* from being turned on. The signal Qa controls permission or prohibition of conduction of the switching element 2*a*.

The second signal S2*x* is input to the set end P100*b*. The second signal S2*x* takes logical value "H", so that the signal Qb output from the output end P102*b* takes logical value "H". The second signal S2*y* is input to the reset end P101*b*. The second signal S2*y* takes logical value "H", so that the signal Qb takes logical value "L".

Owing to the function of the latch circuit 6*b*, the signal Qb takes a logical value reflecting the logical value of the first signal S1*x*. Similar to the first signal S1*x*, the signal Qb functions as a drive-on signal that permits the switching element 2*b* to be turned on. Similarly to the first signal S1*y*, the signal Qb also functions as a drive-off signal that prohibits the switching element 2*b* from being turned off. The signal Qb controls permission or prohibition of conduction of the switching element 2*b*.

The signal Qa is input to the input end P1*i*10*a*. The logic circuit 5*a* generates a signal Ka from the signal Qa and outputs the signal Ka from the output end P111*a*. The signal Qb is input to the input end P110*b*. The logic circuit 5*b* generates a signal Kb from the signal Qb and outputs the signal Kb from the output end P111*b*. The signal Kb is provided to the input end P123. The signal Ka is provided to the input end P120.

The driver 3*a* amplifies the signal Ka with a predetermined gain to drive the switching element 2*a*. The driver 3*b* amplifies the signal Kb with a predetermined gain to drive the switching element 2*b*.

The signal Qa functions as both a drive-on signal and a drive-off signal for the switching element 2*a*. When the signal Qa takes logical value "H", for example, the logic circuit 5*a* modulates the signal Qa to generate the signal Ka. Similarly, when the signal Qb takes logical value "H", for example, the logic circuit 5*b* modulates the signal Qb to generate the signal Kb, for example. For example, the signal Ka is intermittently activated when the signal Qa takes logical value "H" and is not activated when the signal Qa takes logical value "L". For example, the signal Kb is intermittently activated when the signal Qb takes logical value "H" and is not activated when the signal Qb takes logical value "L".

Since the logical values of the first signals S1*a* and S1*x* are exclusively set at "H" and the logical values of the signals Qa and Qb are also exclusively set at "H", the signals Ka and Kb generated as described above do not simultaneously turn on the switching elements 2*a* and 2*b* when the second signals S2*a*, S2*b*, S2*x*, and S2*y* are normally obtained. The switching elements 2*a* and 2*b* are exclusively turned on but are not necessarily turned on complementarily.

When the on-resistance of the switching element 2*a* is ignored, turning on of the switching element 2*a* in a state where the switching element 2*b* is off results in the output potential OUT rises toward the potential HV. When the on-resistance of the switching element 2*b* is ignored, turning on of the switching element 2*b* in a state where the switching element 2*a* is off results in the output potential OUT decreases toward the potential G3.

The second circuit 200*a* of the signal transmission circuit 1000*a*, the second circuit 200*b* of the signal transmission circuit 1000*b*, and the driver 3*a* are all connected to the output line 7 and operate with the output potential OUT as a reference potential. The output potential OUT varies between the potential G3 and the potential HV in accordance with the time of the ON state of the switching elements 2*a* and 2*b*. The potential difference between the potentials G3 and HV is, for example, several hundred to several thousand V.

The control circuit 4 and the first circuits 100*a*, 100*b*, 100*x*, and 100*y* are not directly connected to the output line 7. The control circuit 4 is separated from the drivers 3*a* and 3*b* and the switching elements 2*a* and 2*b* in terms of direct current.

For example, even if the drivers 3*a* and 3*b* and the switching elements 2*a* and 2*b* are arranged in a high voltage region in consideration of the potential HV, the control circuit 4 can be arranged in a low voltage region separated from the high voltage region in terms of direct current. Such an arrangement contributes to the prevention of malfunction of the control circuit 4 and the prevention of electric shock.

<2-4. Output Potential OUT as Reference for Potential of Second Circuit>

It is assumed that an event similar to the high latch of the second signal S2 caused by the malfunction of the detection circuit 240 in the second circuit 200 described with reference to FIG. 3 in the first exemplary preferred embodiment occurs in either or both of the second signals S2*a* and S2*b*. In such a case, both of the second signals S2*a* and S2*b* are set at "H", and the signal Qa may not normally function as a drive-on signal such as the first signal S1*a* or a drive-off signal such as the first signal S1*b*. The same applies to the signal Qb.

The fact that the signals Qa and Qb do not normally function as a drive-on signal or a drive-off signal as described above may cause an event in which the switching elements 2*a* and 2*b* are simultaneously turned on. In order to avoid such an event, it is desirable that an event similar to the high latch of the second signal S2 does not occur in the second signals S2*a*, S2*b*, S2*x*, and S2*y*.

The power conversion apparatus 2000 adopts the signal transmission circuits 1000*a*, 1000*b*, 1000*x*, and 1000*y*, and each of the self-reset circuits 241*a*, 241*b*, 241*x*, and 241*y* in the second circuits 200*a*, 200*b*, 200*x*, and 200*y* included in the respective signal transmission circuits can operate similarly to the second circuit 200 in the signal transmission circuit 1000, thereby contributing to the prevention of the high latch in the second signals S2*a*, S2*b*, S2*x*, and S2*y*.

Therefore, in the power conversion apparatus 2000 according to the second preferred embodiment, malfunction of the switching elements 2*a* and 2*b* is suppressed.

<2-5. Variation in Potential G2>

When the switching elements 2*a* and 2*b* are opened and closed, the output potential OUT varies between the potentials G3 and HV. The variation in the potential G2 described using the signal transmission circuit 1000 is caused by, for example, a variation in the output potential OUT when the signal transmission circuit 1000 is adopted as the signal transmission circuits 1000*a* and 1000*b*. Similar to the variation in the potential G2, the variation in the output potential OUT also introduces the time derivative dv/dt of the voltage.

For simplicity of explanation, the following will exemplify a case where the switching element 2*b* is turned off and the output potential OUT decreases toward the potential G3 ($dv/dt<0$) in a state where the switching element 2*a* is off. In a case where the switching element 2*b* is turned on and the output potential OUT rises toward the potential HV in a state where the switching element 2*a* is off, the sign of the time derivative dv/dt differs. The following will deal with an event caused by the time derivative dv/dt, and hence the following operation and effect can be obtained in any case by alternatively reading the flow direction of the displacement current depending on the sign of the time derivative dv/dt.

In addition, a description will be made assuming a case where the potentials G1 and G3 are equal. The following will deal with an event caused by the time derivative dv/dt. This assumption is based on a difference in DC voltage and does not have any influence on the time derivative dv/dt itself. Therefore, even in a case where the potentials G1 and G3 are different, the following effects can be obtained.

For example, an increase in the voltage variation Vdif in the signal transmission circuit 1000 illustrated in FIGS. 2 and 3 occurs before and after the trailing edge of the first signal S1 illustrated in FIGS. 2 and 3. The voltage variation Vdif is caused by, for example, the turn-off of the switching element 2*b* in response to a trailing edge of the first signal Sla when the signal transmission circuit 1000 is used as the signal transmission circuit 1000*a*.

However, the voltage variation Vdif illustrated in FIGS. 2 and 3 corresponds to an increase in voltage caused by the turn-off of the switching element 2*b* in response to one trailing edge of the logical value of the first signal S1*a* provided to the signal transmission circuit 1000*a*. The transition of the logical value of the first signal S1 illustrated in FIGS. 2 and 3 corresponds to the transition of the logical value of the first signal S1*a* generated after the first signal S1*a* having a trailing edge to which the turn-off responds.

The turn-off of the switching element 2*b* in response to a trailing edge of the logical value of a certain first signal S1*a* is delayed from the trailing edge due to the operation of the signal transmission circuit 1000*a*. Since a similar delay also occurs in the signal transmission circuit 1000, the above correspondence relationship may occur.

Similar to the voltage variation Vdif in the signal transmission circuit 1000, also in the signal transmission circuit 1000*a*, the potential of the third end P3*a* rises at $-(dv/dt)\cdot Cpa\cdot Ra\hat{}$. Here, the symbol Cpa represents the electrostatic capacitance value of the parasitic capacitance Cpa, and the symbol Ra^ represents the resistance value of the equivalent resistance of the second circuit 200*a*. Similarly, also in the signal transmission circuit 1000*b*, the potential of the third end P3*b* rises at $-(dv/dt)\cdot Cpb\cdot Rb\hat{}$. Here, the symbol Cpb indicates the electrostatic capacitance value of the parasitic capacitance Cpb, and the symbol Rb^ indicates the resistance value of the equivalent resistance of the second circuit 200*b*.

These rises may cause the high latches described in FIG. 3 and are desirably suppressed. For example, the parasitic capacitance Cpa is charged and discharged with the current represented by the product of the time derivative dv/dt and the electrostatic capacitance value of the parasitic capacitance Cpa, and the parasitic capacitance Cpb is charged and discharged with the current represented by the product of the time derivative dv/dt and the electrostatic capacitance value of the parasitic capacitance Cpb.

Also in the charging and discharging of the parasitic capacitance Cp by the clamp circuits 205 and 206 in the signal transmission circuit 1000, similarly to the charging and discharging of the parasitic capacitances Cpa and Cpb, the current represented by the product of the time derivative dv/dt and the electrostatic capacitance value of the parasitic capacitance Cp flows.

The parasitic capacitance Cpa is charged and discharged via either or both of the clamp circuits 205*a* and 206*a*. The parasitic capacitance Cpb is charged and discharged via either or both of the clamp circuits 205*b* and 206*b*. Similarly to the clamp circuits 205 and 206 in the signal transmission circuit 1000, the clamp circuits 205*a* and 206*a* contribute to the suppression of charging and discharging of the parasitic capacitance Cpa, and the clamp circuits 205*b* and 206*b* contribute to the suppression of charging and discharging of the parasitic capacitance Cpb.

Figure 9:
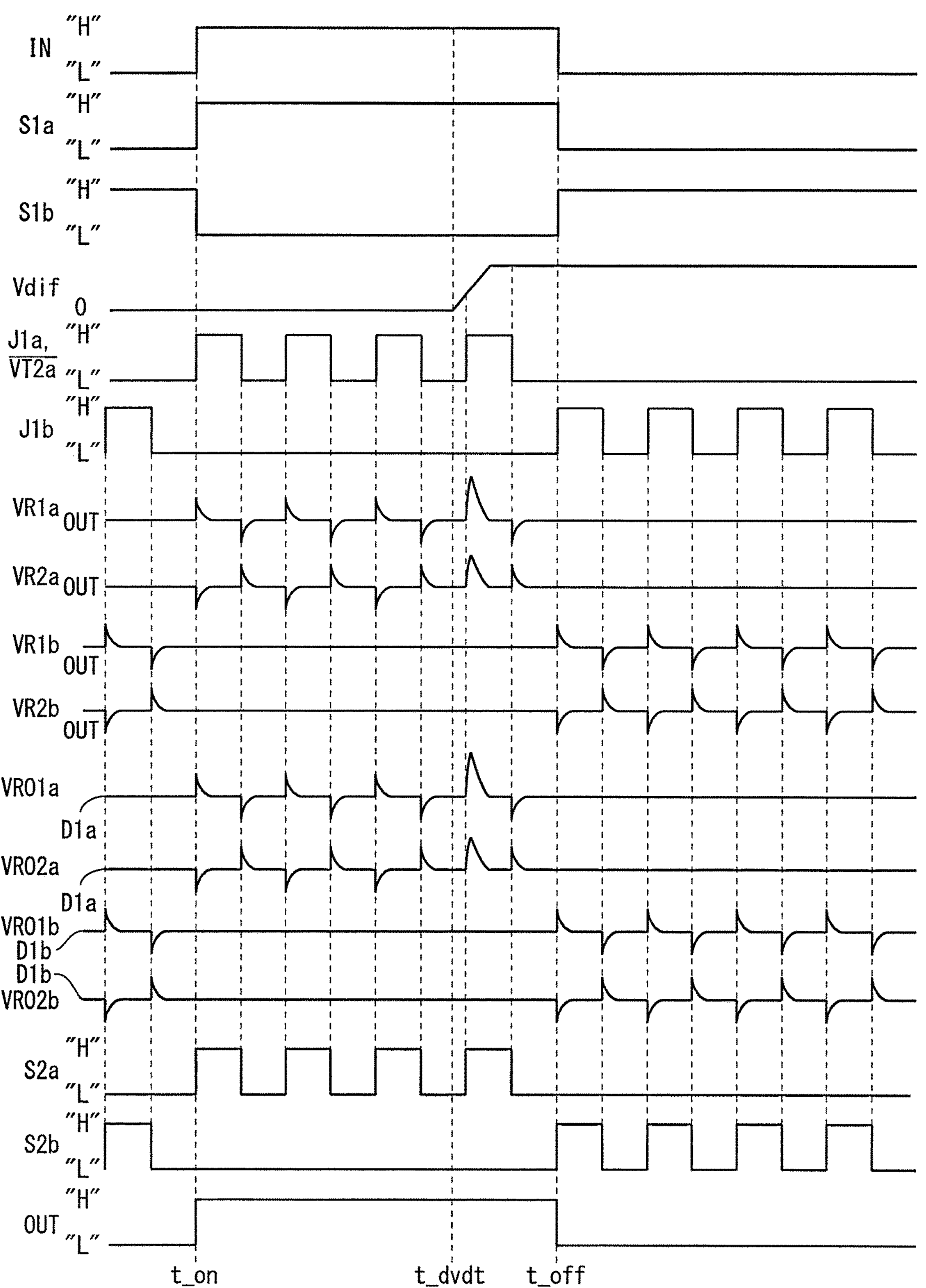
FIG. 9 is a waveform diagram illustrating temporal changes in various signals in the signal transmission circuits 1000*a* and 1000*b*.

FIG. 9 is a waveform diagram illustrating temporal changes in various signals in the signal transmission circuits 1000*a* and 1000*b*. Specifically, FIG. 9 illustrates the waveforms of the logical value of the input signal IN, the logical values of the first signals S1*a* and S1*b*, the logical values of the signals J1*a* and J1*b*, the reception signals VR1*a*, VR2*a*, VR1*b*, and VR2*b*, the signals VRO1*a*, VRO2*a*, VRO1*b*, and VRO2*b*, the second signals S2*a* and S2*b*, and the logical value of the output potential OUT. FIG. 9 also illustrates the waveform of the voltage variation Vdif. FIG. 9 also illustrates an inversion of the logical value of the transmission signal VT2*a* together with the signal J1*a* by adding an overbar above the symbol "VT2*a*".

The logical value of the input signal IN rises from "L" to "H" at time t_on. In response to this, the logical value of the first signal S1*a* also rises at time t_on, and the logical value of the first signal S1*b* falls from "H" to "L" at time t_on.

The logical value of the input signal IN falls from "H" to "L" at time t_off. In response to this, the logical value of the first signal S1*a* also falls at time t_off, and the logical value of the first signal S1*b* rises from "H" to "L" at time t_off.

The signal J1*a* outputs a pulse train in a period in which the logical value of the first signal S1*a* is at "H". FIG. 9 illustrates a case where the signal J1*a* outputs four pulses in a period in which the logical value of the first signal S1*a* is at "H". The signal J1*b* outputs a pulse train in a period in which the logical value of the first signal S1*b* is at "H".

The reception signals VR1*a*, VR2*a*, VR1*b*, and VR2*b* all vary with reference to the output potential OUT. FIG. 9 illustrates the waveforms in which the reception signals VR1*a* and VR2*a* temporarily rise and fall, respectively, at the time when a pulse in the signal J1*a* rises, and attenuate thereafter. A current ia flowing through the first coil 11*a* and a mutual inductance La between the first coil 11*a* and the second coil 12*a* are introduced. The value of the reception signal VR1*a* is represented by La·(dia/dt), and the value of the reception signal VR2*a* is represented by −La·(dia/dt).

FIG. 9 illustrates the waveforms in which the reception signals VR1*a* and VR2*a* temporarily fall and rise, respectively, at the time when a pulse in the signal J1*a* falls, and attenuate thereafter. The value of the reception signal VR1*a* at this time is represented by −La·(dia/dt), and the value of the reception signal VR2*a* is represented by La·(dia/dt).

FIG. 9 illustrates the waveforms in which the reception signals VR1*b* and VR2*b* temporarily rise and fall, respectively, at the time when a pulse in the signal J1*b* rises, and attenuate thereafter. A current ib flowing through the first coil 11*b* and a mutual inductance Lb between the first coil 11*b* and the second coil 12*b* are introduced. The value of the reception signal VR1*b* is represented by Lb·(dib/dt), and the value of the reception signal VR2*b* is represented by −Lb·(dib/dt).

FIG. 9 illustrates the waveforms in which the reception signals VR1*b* and VR2*b* temporarily fall and rise, respectively, at the time when a pulse in the signal J1*b* falls, and attenuate thereafter. The value of the reception signal VR1*b* at this time is represented by −Lb·(dib/dt), and the value of the reception signal VR2*b* is represented by Lb·(dib/dt).

Similarly to FIG. 2, the voltage variation Vdif starts to rise from time t_dvdt. FIG. 9 illustrates the waveforms in which both the reception signals VR2*a* and VR1*a* rise at the time when a pulse in the signal J1*a* rises in a rise period and attenuates thereafter. Since no pulse train occurs in the signal J1*b* during a rise period, such an exceptional waveform does not occur in the reception signal VR2*b*.

The signals VRO1*a*, VRO2*a*, VRO1*b*, and VRO2*b* have waveforms similar to the waveforms of the reception signals VR1*a*, VR2*a*, VR1*b*, and VR2*b*, respectively. Owing to the high-pass filter obtained by the capacitor 221*a* and the voltage dividing resistor 223*a* and the DC offset voltage circuit 225*a*, the signal VRO1*a* exhibits a rise, a subsequent decay, a fall, and a subsequent decay similar to the reception signal VR1*a* with reference to the DC voltage D1*a*. Owing to the high-pass filter obtained by the capacitor 222*a* and the voltage dividing resistor 224*a* and the DC offset voltage circuit 225*a*, the signal VRO2*a* exhibits a rise and a subsequent decay similar to the reception signal VR2*a* with reference to the DC voltage D1*a*. Owing to the high-pass filter obtained by the capacitor 221*b* and the voltage dividing resistor 223*b* and the DC offset voltage circuit 225*b*, the signal VRO1*b* exhibits a rise, a subsequent decay, a fall, and a subsequent decay similar to the reception signal VR1*b* with reference to the DC voltage D1*b*. Owing to the high-pass filter obtained by the capacitor 222*b* and the voltage dividing resistor 224*b* and the DC offset voltage circuit 225*b*, the signal VRO2*b* exhibits a rise and a subsequent decay similar to the reception signal VR2*b* with reference to the DC voltage D1*b*.

FIG. 9 illustrates a case where the influence of the voltage variation Vdif on the subtraction voltage value ΔVa (the potential difference between the signal VRO1*a* and the signal VRO2*a*, specifically, the value obtained by subtracting the potential of the signal VRO2*a* from the potential of the signal VRO1*a*) is small even in a rise period, and the subtraction voltage value changes from a state of being less than the first threshold value to a state of being equal to or greater than the first threshold value. A case where the logical value of the second signal S2*a* rises from "L" to "H" according to operation (i) described above is exemplified.

Figure 10:
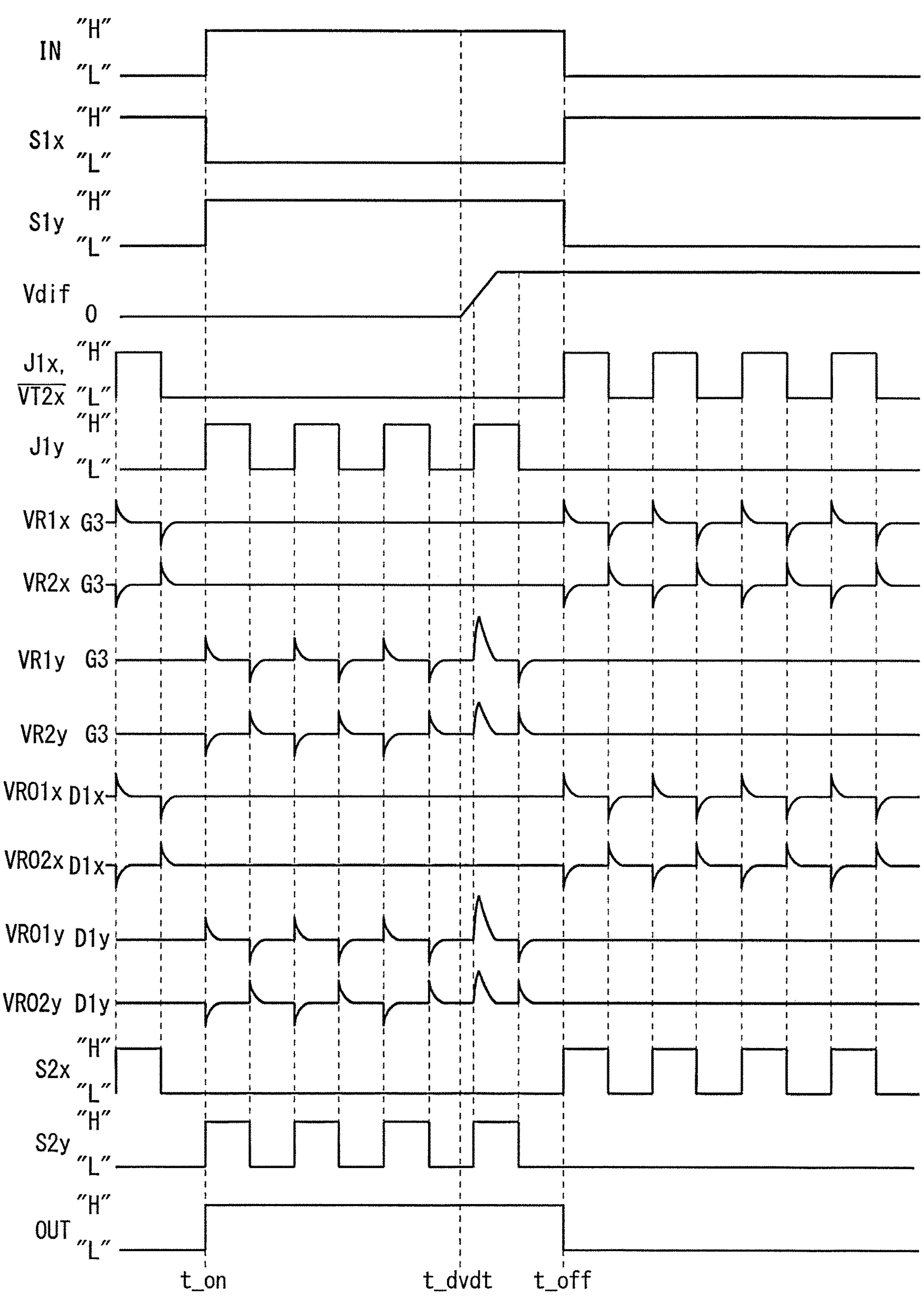
FIG. 10 is a waveform diagram illustrating temporal changes in various signals in the signal transmission circuits 1000*x* and 1000*y*.

FIG. 10 is a waveform diagram illustrating temporal changes in various signals in the signal transmission circuits 1000*x* and 1000*y*. Specifically, FIG. 10 illustrates the waveforms of the logical value of the input signal IN, the logical values of the first signals S1*x* and S1*y*, the logical values of the signals J1*x* and J1*y*, the reception signals VR1*x*, VR2*x*, VR1*y*, and VR2*y*, the signals VRO1*x*, VRO2*x*, VRO1*y*, and VRO2*y*, the second signals S2*x* and S2*y*, and the logical value of the output potential OUT. FIG. 10 also illustrates an inversion of the logical value of the transmission signal VT2*x* together with the signal J1*x* by adding an overbar above the symbol "VT2*x*".

For example, since the first signals S1*a* and S1*x* exclusively take logical value "H" and are activated, the waveforms of the logical values of the first signals S1*x* and S1*y* in FIG. 10 transition similarly to the waveforms of the logical values of the first signals S1*b* and S1*a* in FIG. 9, respectively.

Therefore, the waveforms of the logical values of the signals J1*x* and J1*y*, the reception signals VR1*x*, VR2*x*, VR1*y*, and VR2*y*, the signals VRO1*x*, VRO2*x*, VRO1*y*, and VRO2*y*, and the logical values of the second signals S2*x* and S2*y* in FIG. 10 appear similarly to the waveforms of the logical values of the signals J1*b* and J1*a*, the reception signals VR1*b*, VR2*b*, VR1*a*, and VR2*a*, the signals VRO1*b*, VRO2*b*, VRO1*a*, and VRO2*a*, and the second signals S2*b* and S2*a* in FIG. 10, respectively.

FIG. 10 illustrates a case where the influence of the voltage variation Vdif on the subtraction voltage value ΔVy (the potential difference between the signal VRO1*y* and the signal VRO2*y*, specifically, the value obtained by subtracting the potential of the signal VRO2*y* from the potential of the signal VRO1*y*) is small even in a rise period, and the subtraction voltage value changes from a state of being less than the first threshold value to a state of being equal to or greater than the first threshold value. A case where the logical value of the second signal S2*y* rises from "L" to "H" according to operation (i) described above is exemplified.

However, since the signal transmission circuits 1000*x* and 1000*y* use the potential G3 as a reference for potential, the reception signals VR1*x*, VR2*x*, VR1*y*, and VR2*y* vary with respect to the potential G3. Since the DC offset voltage circuit 225x outputs the DC voltage D1x with reference to the potential G3, the signals VRO1x and VRO2x vary with reference to the DC voltage D1x. Since the DC offset voltage circuit 225y outputs the DC voltage D1y with reference to the potential G3, the signals VRO1y and VRO2y vary with reference to the DC voltage D1y.

At time t_on, the logical value of the second signal S2b is at "L" (see FIG. 9), and the rising of the logical value of the second signal S2a causes the logical value of the signal Qa (not illustrated) to be at "H". The logical value of the second signal S2x is at "L" (see FIG. 10), and the rising of the logical value of the second signal S2y causes the logical value of the signal Qb (not illustrated) to be at "L". The logical value of the output potential OUT is set at "H".

At time t_off, the logical value of the second signal S2a is at "L" (see FIG. 9), and the rising of the logical value of the second signal S2b causes the signal Qa (not illustrated) to be at "L". The logical value of the second signal S2y is at "L" (see FIG. 10), and the rising of the logical value of the second signal S2x causes the signal Qb (not illustrated) to be at "H". The logical value of the output potential OUT is set at "L".

As described above, when the subtraction voltage value is less affected by the voltage variation Vdif, the logical value of the input signal IN is reflected in the logical value of the output potential OUT.

<2-6. Settings in Current Limiting Resistor>

It can be said that the resistor 207a in the clamp circuit 205a in the signal transmission circuit 1000a is a current limiting resistor that limits the magnitude of a current flowing through the diodes 201a and 202a and contributing to charging and discharging of the parasitic capacitance Cpa. Similarly, it can be said that the resistor 208a in the clamp circuit 206a is a current limiting resistor that limits the magnitude of a current flowing through the diodes 203a and 204a and contributing to charging and discharging of the parasitic capacitance Cpa. Similarly, it can be said that all of the resistors 207b and 208b in the signal transmission circuit 1000b, the resistors 207x and 208x in the signal transmission circuit 1000x, the resistors 207y and 208y in the signal transmission circuit 1000y, and the resistor 207, 208 in the signal transmission circuit 1000 are current limiting resistors.

Figure 11:
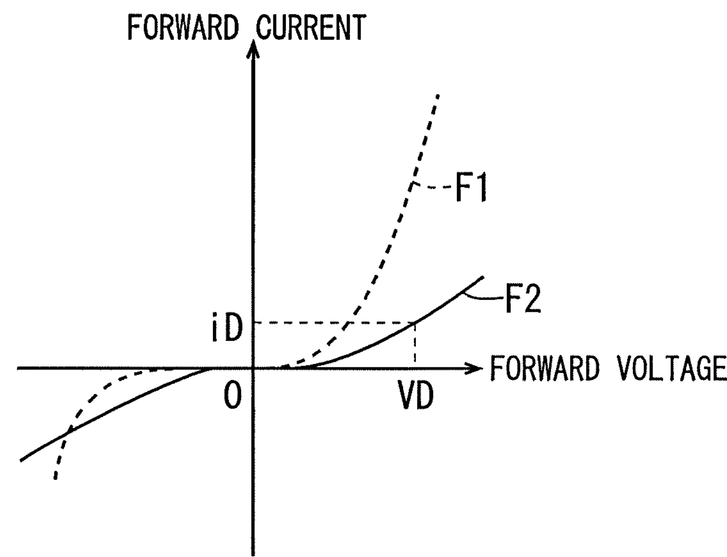
FIG. 11 is a graph illustrating the rectification characteristics of a diode.

FIG. 11 is a graph illustrating the rectification characteristics of a diode. The abscissa indicates a forward voltage, and the ordinate indicates a forward current. The diode can be adopted as any of the diodes 201a, 202a, 203a, 204a, 201b, 202b, 203b, 204b, 201x, 202x, 203x, 204x, 201y, 202y, 203y, and 204y. A curve F1 indicates a current flowing through the diode when no current limiting resistor is provided, and a curve F2 indicates a current flowing through the diode when a current limiting resistor is provided.

In a case where a current limiting resistor is provided, the forward current iD flows when the forward voltage VD is applied to the diode. As can be seen from the comparison between the curves F1 and F2, the forward current decreases by providing a current limiting resistor. A current flowing through the clamp circuit 206a corresponds to any of the forward current iD flowing through the diode 201a and the forward current iD flowing through the diode 202a. A current flowing at the charging and discharging of the parasitic capacitance Cpa is the product of the electrostatic capacitance value of the parasitic capacitance Cpa and the time derivative (dv/dt). Therefore, setting the resistor 207a according to the assumed value of the time derivative (dv/dt) limits the displacement current for charging and discharging the parasitic capacitance Cpa, and thus, reduces the influence of the voltage variation Vdif on the reception signals VR1a and VR2a, and contributes to the suppression of the malfunction of the detection circuit 240a. Setting the resistor 208a in the same manner contributes to the suppression of the malfunction of the detection circuit 240b.

For example, when the output potential OUT decreases due to the turn-on of the switching element 2b, a displacement current flowing through the diode 202a of the clamp circuit 205a and the diode 204a of the clamp circuit 206a to discharge the parasitic capacitance Cpa is limited, and the influence of the voltage variation Vdif on the reception signals VR1a and VR2a is reduced, which contributes to the suppression of the malfunction of the detection circuit 240a. The displacement current flowing through the diode 202b of the clamp circuit 205b and the diode 204b of the clamp circuit 206b to discharge the parasitic capacitance Cpb is limited, and the influence of the voltage variation Vdif on the reception signals VR1b and VR2b is reduced, which contributes to the suppression of the malfunction of the detection circuit 240b.

When the output potential OUT increases due to the turn-on of the switching element 2a as well, a displacement current flowing through the diode 201a of the clamp circuit 205a and the diode 203a of the clamp circuit 206a to charge the parasitic capacitance Cpa is limited, and the influence of the voltage variation Vdif on the reception signals VR1a and VR2a is reduced, which contributes to the suppression of the malfunction of the detection circuit 240a. The displacement current flowing through the diode 201b of the clamp circuit 205b and the diode 203b of the clamp circuit 206b to charge the parasitic capacitance Cpb is limited, and the influence of the voltage variation Vdif on the reception signals VR1b and VR2b is reduced, which contributes to the suppression of the malfunction of the detection circuit 240b.

Similarly, the displacement current flowing through the diode 201x of the clamp circuit 205x and the diode 203x of the clamp circuit 206x to charge the parasitic capacitance Cpx is limited, and the influence of the voltage variation Vdif on the reception signals VR1x and VR2x is reduced, which contributes to the suppression of the malfunction of the detection circuit 240x. The displacement current flowing through the diode 202x of the clamp circuit 205x and the diode 204x of the clamp circuit 206x to discharge the parasitic capacitance Cpx is limited, and the influence of the voltage variation Vdif on the reception signals VR1x and VR2x is reduced, which contributes to the suppression of the malfunction of the detection circuit 240x.

Similarly, the displacement current flowing through the diode 201y of the clamp circuit 205y and the diode 203y of the clamp circuit 206y to charge the parasitic capacitance Cpy is limited, and the influence of the voltage variation Vdif on the reception signals VR1y and VR2y is reduced, which contributes to the suppression of the malfunction of the detection circuit 240y. The displacement current flowing through the diode 202y of the clamp circuit 205y and the diode 204y of the clamp circuit 206y to discharge the parasitic capacitance Cpy is limited, and the influence of the voltage variation Vdif on the reception signals VR1y and VR2y is reduced, which contributes to the suppression of the malfunction of the detection circuit 240y.

The settings of the resistors 207a, 208a, 207b, 208b, 207x, 208x, 207y, and 208y contribute to the suppression of the malfunction of the detection circuits 240a, 240b, 240x, and 240y and hence contribute to the output potential OUT appropriately reflecting the input signal IN.

Similarly, also in the signal transmission circuit 1000, setting the resistors 207 and 208 in accordance with the assumed value of the time derivative (dv/dt) limits the displacement current for charging and discharging the parasitic capacitance Cp. Such limitation contributes to a reduction in the influence of the voltage variation Vdif on the reception signals VR1 and VR2, and thus, the suppression of malfunction of the detection circuit 240. Such contribution contributes to the second signal S2 appropriately reflecting the signal J1, and thus, appropriately transmitting the first signal S1 to the second signal S2.

However, when the time derivative (dv/dt) exceeds an assumed value, the displacement current caused by the time derivative (dv/dt) may be larger than the charge and discharge current flowing as the forward current iD set by the current limiting resistor described above. In this case, the high latch described in FIG. 3 may also occur in the signal transmission circuits 1000*a*, 1000*b*, 1000*x*, and 1000*y*.

Similarly to the self-reset circuit 241 in the signal transmission circuit 1000 contributing to the avoidance of high latch, the self-reset circuits 241*a*, 241*b*, 241*x*, and 241*y* contribute to the avoidance of high latch in the signal transmission circuits 1000*a*, 1000*b*, 1000*x*, and 1000*y*, respectively, and hence contributing to the output potential OUT appropriately reflecting the input signal IN.

Note that the self-reset circuits 241*a*, 241*b*, 241*x*, and 241*y* contribute to the avoidance of high latch in the detection circuits 240*a*, 240*b*, 240*x*, and 240*y*, respectively, but do not directly influence the waveform of the output potential OUT. This is because the second signals S2*a* and SS2*b* are inputs to the latch circuit 6*a*, the second signals S2*x* and S2*y* are inputs to the latch circuit 6*b*, and the logical value of the output potential OUT is based on the logical value of the signal Qa output from the latch circuit 6*a* and the logical value of the signal Qb output from the latch circuit 6*b*.

For example, in the case of the upper arm circuit 2000*a*, it is assumed that high latch has occurred in the detection circuit 240*a*, that is, the logical value of the second signal S2*a* maintains "H" even after the logical value of the first signal S1*a* transitions from "H" to "L" and the logical value of the first signal S1*b* transitions from "L" to "H". At this time, both of the second signals S2*a* and S2*b* take logical value "H" and the logical value of the signal Qa becomes uncertain, so that the logical value of the output potential OUT may be maintained at "H".

However, thereafter, when the logical value of the first signal S1*a* transitions from "L" to "H" and the logical value of the first signal S1*b* transitions from "H" to "L", the signal J1*a* newly generates a pulse train in a state where the logical value of the second signal S2*b* is at "L". Due to the falling of a pulse included in the pulse train, the logical value of the second signal S2*a* takes "L", and the logical value of the output potential OUT takes "L". This reduces the influence that causes the external load 1 to malfunction.

<3. Modifications of Pulse Train>

A third preferred embodiment of the present disclosure relates to modifications of the pulse trains in the signals J1, J1*a*, J1*b*, J1*x*, and J1*y*. Hereinafter, first, the pulse train in signal J1*a* will be described.

Figure 12:
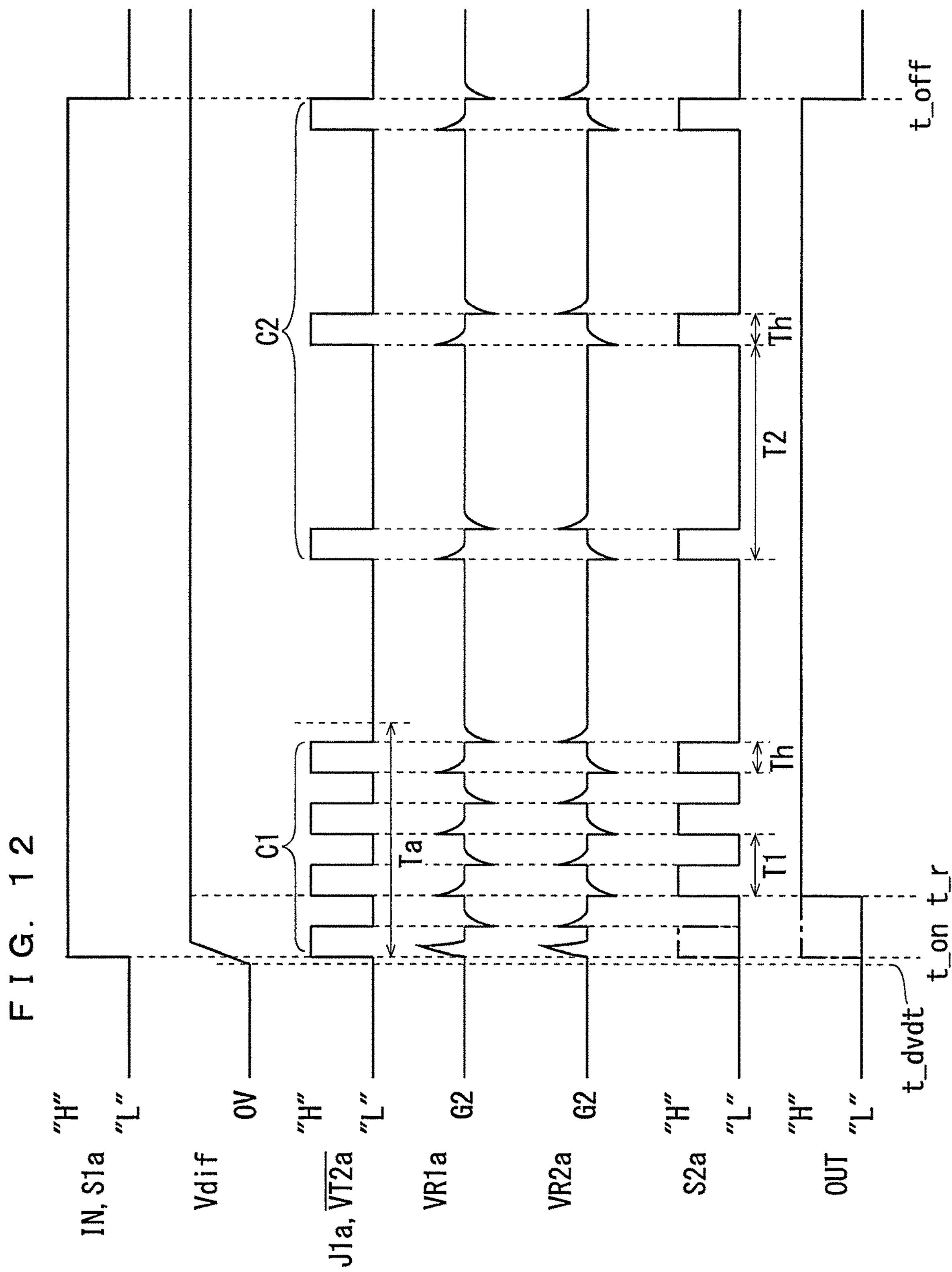
FIG. 12 is a waveform diagram illustrating various signals in a third preferred embodiment.

FIG. 12 is a waveform diagram illustrating various signals in a third preferred embodiment. FIG. 12 illustrates the waveforms of the logical value of an input signal IN, the logical value of the signal J1*a*, reception signals VR1*a* and VR2*a*, the logical value of a second signal S2*a*, and the logical value of an output potential OUT. FIG. 12 also illustrates the waveform of a voltage variation Vdif. The logical value of the input signal IN is the same as the logical value of a first signal S1*a* (see FIG. 9), and both are shown together in FIG. 12.

The logical value of the input signal IN rises from "L" to "H" at time t_on and falls from "H" to "L" at time t_off. The voltage variation Vdif starts increasing at time t_dvdt before time t_on and is also increasing at time t_on. Due to the falling of the logical value of the input signal IN generated before time t_on, the voltage variation Vdif may start to rise before time t_on.

According to the logical value of the signal J1*a*, a pulse train is generated in a period in which the logical value of the first signal S1*a* is at "H". Referring to FIG. 12, the first pulse of the logical value of the signal J1*a* rises at time t_on. At the leading edge, if there is no influence of the voltage variation Vdif, the reception signal VR1*a* rises and the reception signal VR2*a* falls. However, FIG. 12 illustrates a case where the reception signal VR2*a* also rises due to the influence of the voltage variation Vdif rising at time t_on, and the subtraction voltage value does not exceed a first threshold.

Due to the influence of the voltage variation Vdif described above, the second signal S2*a* maintains "L" without reflecting the first pulse of the signal J1*a*. Referring to FIG. 12, a pulse generated in the logical value of the second signal S2*a* when there is no influence of the voltage variation Vdif is indicated by a chain line.

The second pulse of the logical value of the signal J1*a* rises at time t_r. At time t_r, the voltage variation Vdif is in a steady state, and neither of the reception signals VR1*a* and VR2*a* is influenced by the voltage variation Vdif. At time t_r, the reception signal VR1*a* rises, the reception signal VR2*a* falls, and the logical value of the second signal S2*a* rises. A pulse reflecting the pulse train of the logical value of the signal J1*a* is generated in the logical value of the subsequent second signal S2*a*.

The logical value of the output potential OUT rises in response to a leading edge of the logical value of the second signal S2*a*. When the logical value of the second signal S2*a* reflects the first pulse of the logical value of the signal J1*a* (see the pulse indicated by the chain line), the logical value of the output potential OUT rises at time t_on (see the chain line). Due to the influence of the voltage variation Vdif, the logical value of the output potential OUT rises at time t_r.

The logical value of the output potential OUT falls in response to a leading edge of the logical value of the second signal S2*b* (not illustrated). For example, in the second signal S2*b*, since a pulse train is generated in response to a trailing edge of the input signal IN (see FIG. 9), FIG. 12 illustrates a case where the logical value of the output potential OUT falls at time t_off.

Since it is desirable that a leading edge of the logical value of the output potential OUT appropriately reflects a leading edge of the logical value of the input signal IN, when the first pulse of the pulse train of the logical value of the signal J1*a* is not reflected in the logical value of the second signal S2*a*, it is desirable that the pulse generated subsequently is reflected in the logical value of the second signal S2*a*. From such a viewpoint, the occurrence of a pulse train including a plurality of pulses in the logic value of the signal J1*a* contributes to the logic value of the second signal S2*a* appropriately reflecting the logic value of the signal J1*a*, and thus, to the output potential OUT appropriately reflecting the input signal IN, particularly at its leading edge.

If the voltage variation Vdif is increasing also at the time when the second pulse rises (time t_r in view of FIG. 12), there is a possibility that the pulse is not reflected in the logical value of the second signal S2*a*. When the rise period is long, the number of pulses generated in the rise period is large among the pulse trains generated in the logical value of the signal J1*a*. From such a viewpoint, a pulse train may be continuously generated in the logical value of the signal J1*a* during a period in which the logical value of the input signal IN maintains "H", and thus, the logical value of the first signal S1*a* maintains "H".

However, the malfunction in which the waveform of the reception signal VR2*a* is distorted by the voltage variation Vdif and the subtraction voltage value does not exceed the first threshold does not necessarily occur corresponding to all the pulses that rise in a rise period. A displacement current derived from the voltage variation Vdif tends to be smaller as the rise period is longer. This is because the smaller a parasitic capacitance Cpa, the smaller the total amount of displacement current, and the longer the rise period, the smaller the voltage variation Vdif.

Therefore, even if a rise period is assumed to be long, it is not necessary to generate a pulse train over the entire rise period. On the other hand, the voltage variation Vdif having a short rise period generates a large displacement current. Therefore, a pulse generation circuit 101*a* generates a pulse train C1 in the signal J1*a* until an assumed value Ta elapses from time t_on at which the first signal S1*a* rises. The assumed value Ta is set to be equal to or longer than a length assumed as a rise period of the voltage variation Vdif that causes a displacement current having the minimum value that causes malfunction.

A number N of pulses in the pulse train C1 is introduced, and there is the relationship given by $(N-1)\cdot T1+Th<Ta<N\cdot T1$ (N=4 in FIG. 12) between the assumed value Ta, one period T1 of a pulse, and a period length Th in which the pulse is at "H".

For example, when it is assumed that the potential difference between potentials HV and G3 is 1200 V and the time derivative (dv/dt) is 100 kV/μs, the assumed value Ta is set to 1200 V/(100 kV/μs)=12 ns.

After the assumed value Ta has elapsed from time t_on, the pulse generation circuit 101*a* may generate a pulse train (to be temporarily referred to as a "second pulse train"; a pulse train from time t_on until the assumed value Ta elapses is also temporarily referred to as a "first pulse train" hereinafter) C2 in the signal J1*a*. The generation of the second pulse train C2 is desirable from the viewpoint of enhancing the reliability of the signal transmission from the input signal IN to the output potential OUT.

It can be said that the first pulse train C1 has a plurality of pulses generated in a part of the period in which the logical value of the signal J1*a* takes "H", and the second pulse train C2 has a plurality of pulses generated following the first pulse train C1 in the part. The assumed value Ta is adopted as the length of the part.

It is desirable not to generate the second pulse train C2 from the viewpoint of reducing the current consumption. In addition, even in a case where the second pulse train C2 is generated in the logical value of the signal J1*a*, making the generation frequency lower than that of the first pulse train C1 contributes to a reduction in current consumption. For example, one period T2 of a pulse in the second pulse train C2 is longer than one period T1 of a pulse in the first pulse train C1. FIG. 12 exemplifies a case where a pulse of the second pulse train C2 is also at "H" with the length of the period length Th.

Also with regard to the logical value of the signal J1*b*, the pulse generation circuit 101*b* generates a pulse train from time t_off (see FIG. 9) when the logical value of a first signal S1*b* rises until an assumed value Tb elapses. The assumed value Tb is set to be equal to or longer than a length assumed as a rise period of the voltage variation Vdif that causes a displacement current having the minimum value that causes malfunction.

A number M of pulses in the pulse train is introduced, and there is the relationship given by $(M-1)\cdot T1+Th<Tb<M\cdot T1$ between the assumed value Tb, one period T1 of a pulse, and a period length Th in which the pulse is at "H".

Similarly to the case of the second pulse train C2, it is desirable that the pulse generation circuit 101*b* generates a pulse train in the signal J1*b* after the assumed value Tb has elapsed from time t_off from the viewpoint of enhancing the reliability of the signal transmission from the input signal IN to the output potential OUT. The fact that the period of the pulse train is longer than the period of the pulse train generated from time t_off until the assumed value Tb elapses contributes to a reduction in current consumption.

The pulse trains in the signals J1*x* and J1*y* can be modified similarly to the pulse trains in the signals J1*b* and J1*a*. Similarly, a modification similar to the pulse train in the signal J1*a* can be applied to the signal J1.

<4. First Modification of First Circuit>

A fourth preferred embodiment of the present disclosure relates to a first modification of each of the first circuits 100, 100*a*, 100*b*, 100*x*, and 100*y*. The first modification of the first circuit 100 will be described first below.

Figure 13:
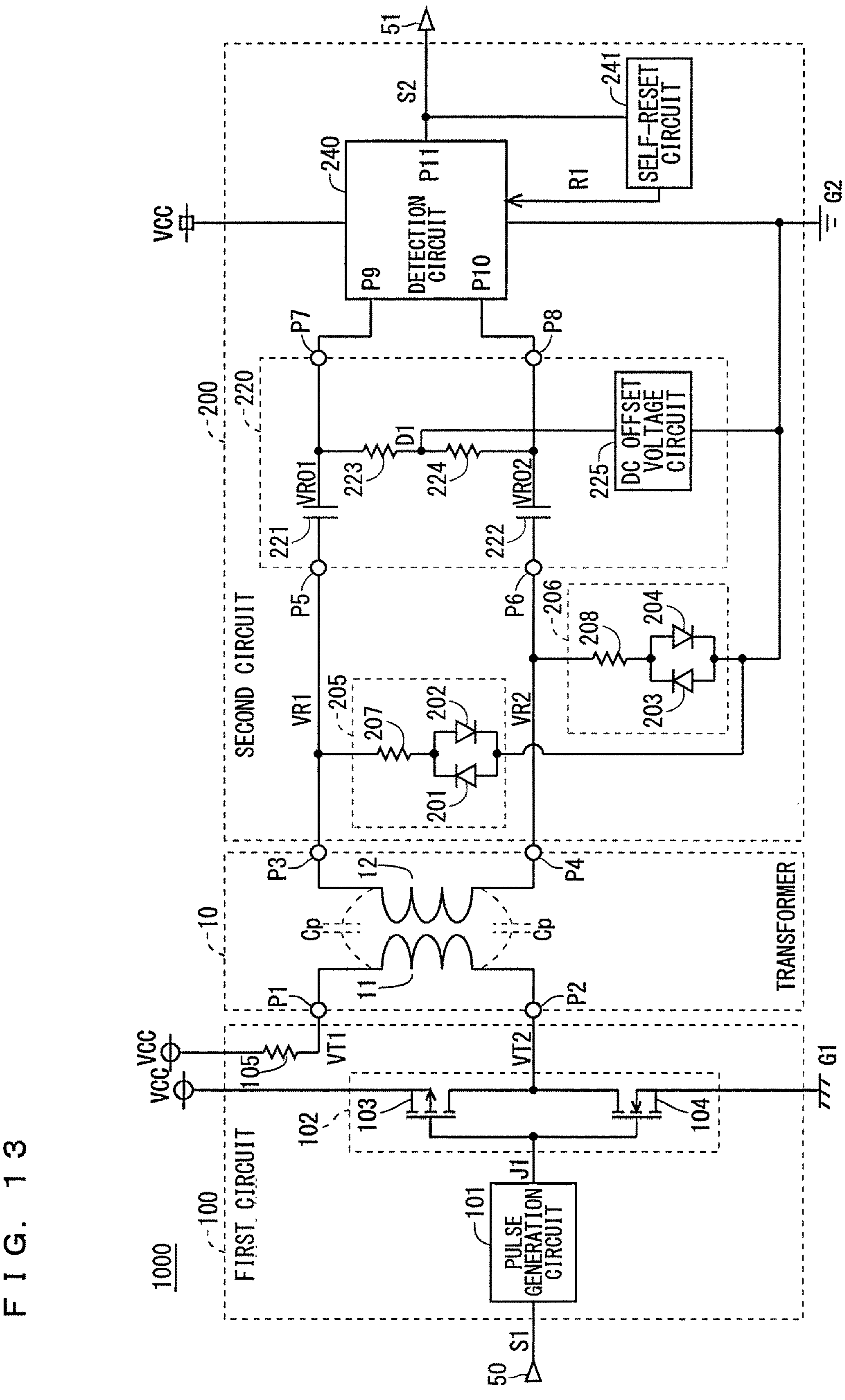
FIG. 13 is a circuit diagram illustrating the configuration of a signal transmission circuit 1000 to which a first circuit 100 according to a fourth preferred embodiment is applied.

FIG. 13 is a circuit diagram illustrating the configuration of the signal transmission circuit 1000 to which the first modification of the first circuit 100 is applied.

In the first modification, the first circuit 100 further includes a resistor 105. The resistor 105 includes one end connected to a first end P1 and the other end to which a potential VCC is applied. In the first circuit 100 illustrated in FIG. 1, the source of the transistor 103 is connected to the first end P1, but in the first modification, the one end of the resistor 105 is connected to the first end P1. A potential VT1 is a potential at the other end of the resistor 105 and is output from the first circuit 100 to the first end P1.

As the resistance value of the resistor 105, a value approximate to the resistance value of the on-resistance of the transistor 103 (to be tentatively referred to as "on-resistance value" hereinafter), specifically, for example, a value of 90% to 110% of the on-resistance value, desirably, a value of 95% to 105% of the on-resistance value is adopted. When a potential G2 serving as a reference for a second circuit 200 becomes higher than a potential G1 serving as a reference for the first circuit 100 due to the influence of a voltage variation Vdif, a displacement current flows through the first circuit 100.

The approximation of the resistance value of the resistor 105 to the on-resistance value of the transistor 103 reduces the difference between the displacement current flowing through one end of the first coil 11 and the first end P1 and the displacement current flowing through the other end of the first coil 11 and the second end P2, thereby contributing to preventing the malfunction (to be described later) due to the difference. From this viewpoint, the wiring resistance from the power supply (not illustrated) that applies the potential VCC to the other end of the resistor 105 to the first end P1 is desirably equal to the wiring resistance from the second end P2 to the power supply (not illustrated) that applies the potential G1 to the source of the transistor 104.

Even if the resistance value of the resistor 105 is different from the on-resistance value of the transistor 103, the effect of reducing the difference between these two types of displacement currents can be obtained even if there is a difference in effect due to the degree of the difference.

Figure 14:
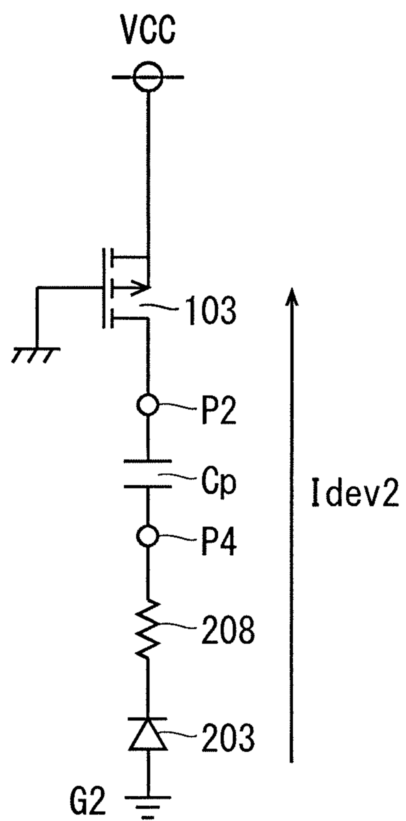
FIG. 14 is a circuit diagram showing a path through which a displacement current Idev2 flows.
Figure 15:
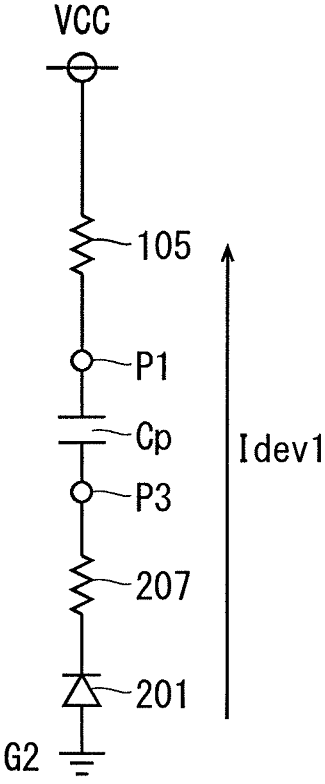
FIG. 15 is a circuit diagram showing a path through which a displacement current Idev1 flows.

FIGS. 14 and 15 are circuit diagrams illustrating elements through which displacement currents Idev1 and Idev2 flow when the potential G2 rises with respect to the potential G1 under the influence of the voltage variation Vdif. FIG. 14 illustrates a path through which the displacement current Idev2 flows via the transistor 103. FIG. 15 illustrates a path through which the displacement current Idev1 flows via the resistor 105.

In the path illustrated in FIG. 14, the displacement current Idev2 flows from a diode 203 and a resistor 208 of a clamp circuit 206 to the transistor 103 via a parasitic capacitance Cp parasitic on a transformer 10 between the second end P2 and a fourth end P4.

In the path illustrated in FIG. 15, the displacement current Idev1 flows from a diode 201 and a resistor 207 of a clamp circuit 205 to the resistor 105 via the parasitic capacitance Cp parasitic on the transformer 10 between the first end P1 and a third end P3.

Here, the displacement currents Idev1 and Idev2 occur in a transition period in which a time derivative dv/dt occurs. The displacement currents Idev1 and Idev2 do not flow between the first end P1 and the second end P2 to which first coil 11 is connected or between the third end P3 and the fourth end P4 to which the second coil 12 is connected. This is because the frequencies of the displacement currents Idev1 and Idev2 generated in the transition period are high, and the impedances of both the first coil 11 and the second coil 12 are high.

When the first circuit 100 illustrated in FIG. 1 is adopted, a potential difference is generated between the first end P1 and the second end P2 due to the on-resistance of the transistor 103 and the displacement current Idev2. Such a potential difference influences a decrease in the amplitude of each pulse of the signal J1 generated by the pulse generation circuit 101, and thus, the amplitudes of the signals VRO1 and VRO2 input to the detection circuit 240, and hence, there is a possibility that correct detection cannot be performed and malfunction occurs. The resistor 105 adopted in the first modification contributes to the suppression of the potential difference and thus contributes to the suppression of the malfunction.

Figure 16:
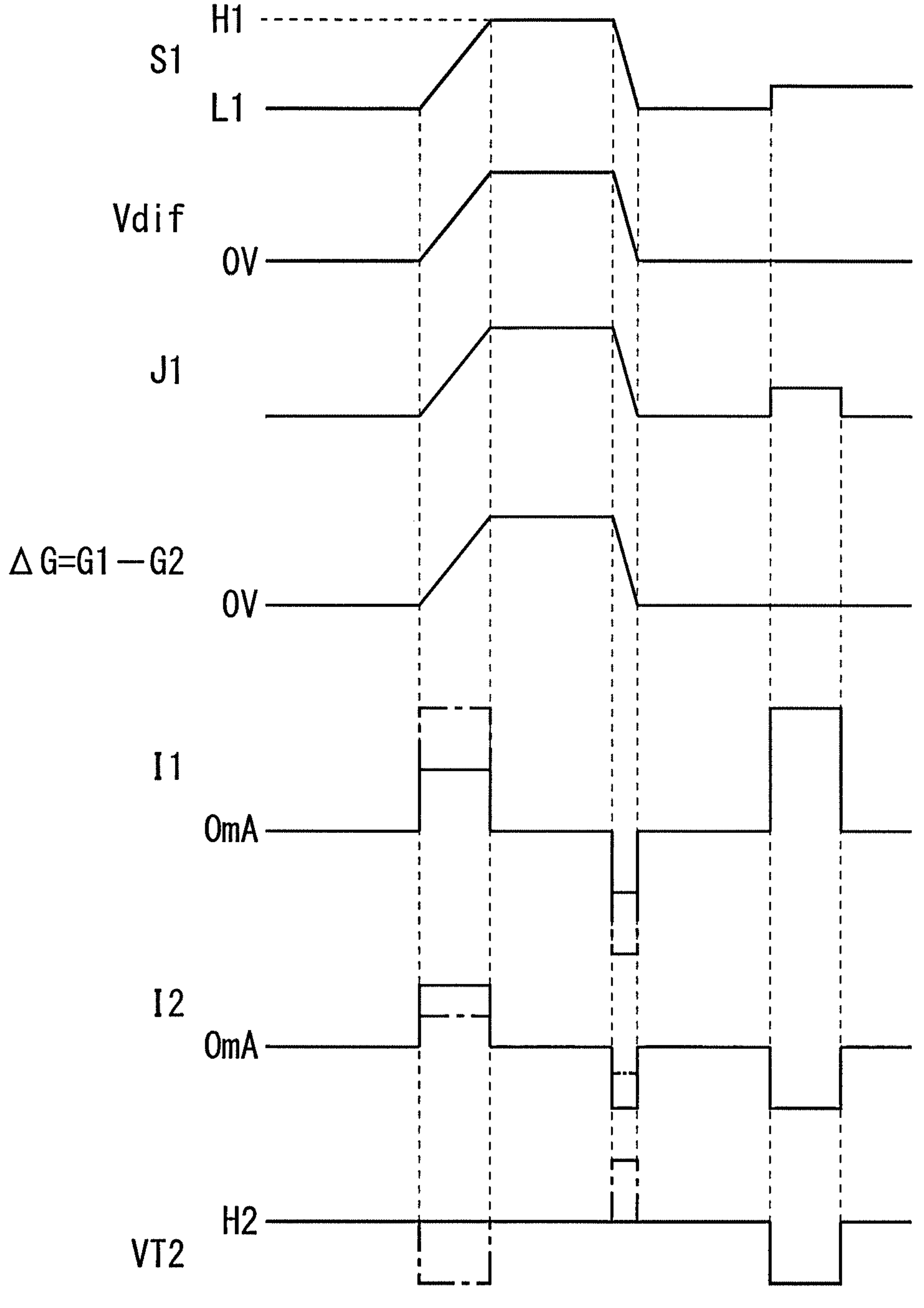
FIG. 16 is a waveform diagram illustrating temporal changes in various signals in the first circuit 100 according to the fourth preferred embodiment.

FIG. 16 is a waveform diagram illustrating temporal changes in various signals in the first modification of the first circuit 100. Specifically, FIG. 16 illustrates the waveforms of the first signal S1, the signal J1, a potential difference ΔG, currents I1 and I2, and a transmission signal VT2 are illustrated.

The current I1 flows through the first end P1, and the current I2 flows through the second end P2. Referring to FIG. 1, the direction from the first circuit 100 to the first coil 11 is positive for each of the currents I1 and I2. A value H1 of the first signal S1 corresponds to logical value "H" of the first signal S1. A value L1 of the first signal S1 corresponds to logical value "L" of the first signal S1. A value H2, with reference to the potential G1, of the transmission signal VT2 corresponds to logical value "H" of the transmission signal VT2. The potential difference ΔG is the voltage (G1-G2) of the potential G1 with reference to the potential G2.

The waveforms indicated by the chain lines indicate a case where the first circuit 100 without the resistor 105 illustrated in FIG. 1 is adopted, and the waveforms indicated by the solid lines indicate a case where the first modification is adopted.

FIG. 16 also illustrates the waveform of the voltage variation Vdif. FIG. 16 exemplifies the occurrence of two events, namely, an increase and a decrease in the time derivative dv/dt in the first coil 11 with respect to the second coil 12.

As indicated by the chain lines, in the absence of the resistor 105, the waveforms of the currents I1 and I2 greatly differ from each other. This is because: the first end P1 is connected to the source of the transistor 103, and the second end P2 is connected to the drain of the transistor 103; the ON resistance of the transistor 103 exists between the first end P1 and the second end P2; and the resistance value from the first end P1 to the power supply which applies the potential VCC is different from the resistance value from the second end P2 to the power supply.

Owing to the difference between the currents I1 and I2, the potential of the transmission signal VT2 temporarily decreases. When a period in which the voltage variation Vdif rises due to the fall of the time derivative dv/dt overlaps a period in which pulses are generated in the logical value of the signal J1, the pulses may be canceled out and disappear to cause a malfunction that the first circuit 100 cannot correctly transmit the transmission signal VT2.

When the resistor 105 is provided, the impedance of the path (see FIG. 15) through which the displacement current Idev1 flows and the impedance of the path (see FIG. 14) through which the displacement current Idev2 flows can be brought close to each other by adjusting the resistance value. As a result, the waveforms of the currents I1 and I2 are approximated each other, the potential of the transmission signal VT2 is less likely to fluctuate, and pulses are less likely to disappear. In this way, the resistor 105 contributes to the prevention of the malfunction of the first circuit 100, and thus, contributes to the output of the appropriate second signal S2.

The first modification can be applied to any of the first circuits 100*a*, 100*b*, 100*x*, and 100*y*. By such application, obtained are second signals S2*a*, S2*b*, S2*x*, and S2*y* appropriately reflecting first signals S1*a*, S1*b*, S1*x*, and S1*y*, specifically, reflecting the pulse trains generated in the signals J1*a*, J1*b*, J1*x*, and J1*y*. The application of the first modification contributes to the output potential OUT output from the power conversion apparatus 2000 appropriately reflecting the input signal IN.

<5. Second Modification of First Circuit>

A fifth preferred embodiment of the present disclosure relates to a second modification of each of the first circuits 100, 100*a*, 100*b*, 100*x*, and 100*y*. The second modification of the first circuit 100 will be described first below.

FIG. 17 is a circuit diagram illustrating the configuration of the signal transmission circuit 1000 to which the second modification of the first circuit 100 is applied. The second modification of the first circuit 100 has a configuration in which the resistor 105 of the first modification of the first circuit 100 is replaced with a transistor 106 in the ON state.

Specifically, in the second modification, the first circuit 100 further includes the P-channel transistor 106. The transistor 106 includes a drain connected to the first end P1 and a source to which a fixed potential VCC is applied. In the first circuit 100 illustrated in FIG. 1, the potential VT1 is output from the source of the transistor 103 to the first end P1. However, in the second modification, a potential VT1 is output from the drain of the transistor 106 to a first end P1.

For example, a potential G1 is applied to the gate of the transistor 106. The potential G1 is lower than the potential VCC applied to the source, and the ON state of the transistor 106 is maintained.

As the transistor 106, a P-channel transistor having an on-resistance value having a small difference from the on-resistance value of the transistor 103 is adopted.

Owing to the similarity that both the transistors 106 and 103 are P-channel transistors, the temperature characteristics of the on-resistance values of both the transistors are similar. Such similarity in temperature characteristics brings about an advantage that the action of preventing the malfunction of the first circuit 100 is less likely to depend on the temperature environment in which the first circuit 100 is used and is easily obtained in a wide temperature range as compared with the fourth exemplary preferred embodiment.

Even if the on-resistance values of the transistors 103 and 106 differ from each other, the effect of reducing the difference between the above two types of displacement currents can be obtained even if there is a difference in effect due to the degree of the difference.

An IGBT may be adopted as the transistor 103. For example, when an IGBT is adopted as the transistor 103, an IGBT is also adopted as the transistor 106. It can be said that the collector and the emitter of the IGBT are a first electrode and a second electrode that are electrically connected to each other by a signal applied to the gate. It can be said that the gate is a third electrode that controls conduction between the first electrode and the second electrode.

In the first circuit 100, the first end P1 and the source of the transistor 104 can be connected via an N-channel transistor in the ON state. As the N-channel transistor in this case, a transistor having an on-resistance value having a small difference from the on-resistance value of the transistor 104 is adopted.

Even if the on-resistance value of the N-channel transistor is different from the on-resistance value of the transistor 103, the effect of reducing the difference between the above two types of displacement currents can be obtained even if there is a difference in effect due to the degree of the difference.

An IGBT may be adopted as the transistor 104. For example, when an IGBT is adopted for the transistor 104, an IGBT in the ON state is adopted instead of the above N-channel transistor.

The second modification can be applied to any of the first circuits 100*a*, 100*b*, 100*x*, and 100*y*. By such application, obtained are second signals S2*a*, S2*b*, S2*x*, and S2*y* appropriately reflecting first signals S1*a*, S1*b*, S1*x*, and S1*y*, specifically, reflecting the pulse trains generated in the signals J1*a*, J1*b*, J1*x*, and J1*y*. The application of the second modification contributes to the output potential OUT output from the power conversion apparatus 2000 appropriately reflecting the input signal IN.

<6. Modification of Limitation on Displacement Current>

Referring to FIGS. 1 and 11, for example, the higher the resistance value of the resistor 207 in the clamp circuit 205, the larger the voltage drop in the resistor 207, and the higher the voltage supported by the diodes 201 and 202, thus making it easy to suppress the influence of the voltage variation Vdif.

The magnitude of a current limiting resistor can also be set from the following viewpoints. For example, when the rectification characteristics of the diodes 201 and 202 are improved in the clamp circuit 205, a displacement current can be limited even if the resistance value of the resistor 207 is lowered, and typically, the resistor 207 may be omitted.

However, when the resistor 207 is omitted, even if a displacement current is suppressed, the reception signals VR1 and VR2 are also suppressed, which is undesirable from the viewpoint of transmitting signals. On the other hand, it is not desirable to lower the rectification characteristics of the diodes 201 and 202 and increase the resistance value of the resistor 207 from the viewpoint of loosening the restriction on a displacement current. It is desirable to set the resistor 207 in consideration of such a trade-off. The same applies to the resistors 208, 207*a*, 208*a*, 207*b*, 208*b*, 207*x*, 208*x*, 207*y*, and 208*y*.

For example, a displacement current can be limited as follows in consideration of the appropriate voltage range of the detection circuit 240, the DC voltage D1, and the assumed time derivative dv/dt.

The upper limit of the appropriate voltage range is substantially lowered by the clamp circuit 205. The lower limit of the appropriate voltage range is substantially increased by the clamp circuit 206. Both the substantial decrease and the increase will be described on the assumption that their absolute values are 1 V.

For example, even when the appropriate voltage range is 0 V to 5 V, the substantial upper limit is lowered to 4 V by the clamp circuit 205, and the substantial upper limit is raised to 1 V by the clamp circuit 206. When the appropriate voltage range is 0 V to 5 V, the median value 2.5 V is adopted as the DC voltage D1. Even if the appropriate voltage range has a substantial upper limit of 4 V and a substantial lower limit of 0 V due to the clamp circuits 205 and 206, the DC voltage D1 may be 2.5 V. This is because the median value between the upper limit and the lower limit is also 2.5 V.

When a displacement current is limited by the clamp circuit 205 and the displacement current is not limited by the clamp circuit 206, the appropriate voltage range is substantially narrowed from the range of 0 V to 5 V to the range of 0 V to 4 V. In this case, the DC voltage D1 desirably has a median value of 2 V in the range of 0 V to 4 V.

Alternatively, when the appropriate voltage range is 0 V to 5 V, but the operation in a region near the boundary is unstable, the region where the operation is unstable may be substantially eliminated using the clamp circuits 205 and 206. For example, when the operation of the detection circuit 240 at 0 V to 0.5 V is unstable, the substantially lower limit of the appropriate voltage range is set to 0.5 V by the clamp circuit 206. For example, when the operation of the detection circuit 240 at 4.5 V to 5 V is unstable, the substantially upper limit of the appropriate voltage range is set to 4.5 V by the clamp circuit 205. Setting the clamp circuits 205 and 206 in this manner to substantially narrow the appropriate voltage range contributes to avoiding an unstable operation of the detection circuit 240.

It is assumed that the appropriate voltage range is 0 V to 5 V, the median value 2.5 V of the DC voltage D1 is adopted, and the substantially appropriate voltage range is narrowed to the range of 2 V to 3 V by the clamp circuits 205 and 206. In such a case, assuming that a variation of the reception signal VR1 increases due to the voltage variation Vdif (see FIG. 2), and for example, a variation of 1 V occurs, the signal VRO1 rises to 3.5 (=2.5+1) V with respect to the potential G2. At this time, the potential of the signal VRO1 exceeds 3 V, which is the upper limit of the appropriate voltage range of the detection circuit 240, and a malfunction may occur in the detection circuit 240.

When the occurrence of the voltage variation Vdif that causes such variation in the reception signal VR1 is assumed, it is desirable to design the clamp circuit 205 such that the upper limit of the substantial appropriate voltage range is higher than 3.5 V, for example, 4 V. If the clamp circuit 205 is designed such that the upper limit of the substantial appropriate voltage range is 4 V and the DC voltage D1 is maintained at 2.5 V, it is desirable to design the clamp circuit 206 such that the lower limit of the substantial appropriate voltage range is 1 V.

The clamp circuits 205*a*, 206*a*, 205*b*, 206*b*, 205*x*, 206*x*, 205*y*, and 206*y* can be similarly designed.

<7. Modification of Lower Arm Circuit 2000*b*>

The output potential OUT serves as a reference for potentials in the signal transmission circuits 1000*a* and 1000*b* of the upper arm circuit 2000*a*. Therefore, similarly to the potential G2 serving as a reference for the potential in the signal transmission circuit 1000, it is desired to reduce the influence of the voltage variation Vdif caused by a variation in the output potential OUT. On the other hand, the potential G3 serving as a reference for potentials in the signal transmission circuits 1000*x* and 1000*y* of the lower arm circuit 2000*b* does not necessarily cause the voltage variation Vdif. From this viewpoint, the signal transmission circuits 1000*x* and 1000*y* do not necessarily have the same configuration as the signal transmission circuit 1000.

Specifically, for example, the self-reset circuits 241*x* and 241*y* may be omitted in the signal transmission circuits 1000*x* and 1000*y*.

Note that the respective preferred embodiments can be freely combined and can be modified and omitted as needed.

Hereinafter, various aspects of the present disclosure will be collectively described as appendixes.

APPENDIX 1

A signal transmission circuit comprising:

a first circuit, to which a first signal is input, configured to generate a transmission signal according to a change in a logical value of the first signal, and uses a first potential as a reference for an operation;

a transformer including a first coil to which the transmission signal is input from the first circuit and a second coil inductively coupled to the first coil and configured to output a pair of reception signals; and a second circuit, to which the pair of reception signals are input from the second coil, configure to generate a second signal by performing comparison with hysteresis with respect to a potential difference between the pair of reception signals, and use a second potential as a reference for an operation, wherein the second circuit includes a detection circuit configured to perform the comparison and output a result of detecting whether the potential difference exceeds a predetermined range as the second signal and a reset circuit configured to reset an operation of the detection circuit when a logical value of the second signal is maintained in a preset period.

APPENDIX 2

The signal transmission circuit according to appendix 1, wherein the second circuit further includes an offset circuit configured to generate a pair of third signals obtained by applying a DC voltage with reference to the second potential as an offset voltage to the pair of reception signals, and the detection circuit generates the second signal by performing the comparison with respect to a potential difference between the pair of third signals generated by the offset circuit.

APPENDIX 3

The signal transmission circuit according to appendix 2, wherein the offset circuit includes a first input terminal to which one of the pair of reception signals is input, a second input terminal to which the other of the pair of reception signals is input, a first output terminal to which one of the pair of third signals is input, a second output terminal to which the other of the pair of third signals is input, a first resistor having one end connected to the first output terminal and the other end to which the DC voltage is applied, a second resistor having one end connected to the second output terminal and the other end to which the DC voltage is applied, a first capacitor connected between the first input terminal and the first output terminal, and a second capacitor connected between the second input terminal and the second output terminal.

APPENDIX 4

The signal transmission circuit according to appendix 3, wherein the second circuit further includes a first clamp circuit and a second clamp circuit connected in series between the first input terminal and the second input terminal, the first clamp circuit includes a first diode, a second diode connected in parallel with the first diode and having a forward direction opposite to a forward direction of the first diode, and a first current limiting resistor connected in series to each of the first diode and the second diode, and the second clamp circuit includes a third diode, a fourth diode connected in parallel with the third diode and having a forward direction opposite to a forward direction of the third diode, and a second current limiting resistor connected in series to each of the third diode and the fourth diode.

APPENDIX 5

The signal transmission circuit according to any one of appendixes 1 to 4, wherein the first circuit includes a pulse generation circuit configured to generate a fourth signal in which a first pulse train having a plurality of pulses in a part of a period in which the first signal takes a first logical value and a second pulse train having a plurality of pulses following the first pulse train in the part occur, and an output circuit configured to generate the transmission signal according to a change in a logical value of the fourth signal, and one period of a pulse in the second pulse train is longer than one period of a pulse in the first pulse train.

APPENDIX 6

The signal transmission circuit according to appendix 5, wherein the output circuit includes a transistor including a first electrode to which a fixed potential is applied, a second electrode configured to output the transmission signal, and a third electrode to which the fourth signal is applied and which controls conduction between the first electrode and the second electrode, and the first circuit further includes a third resistor having one end connected to one end of the first coil and the other end to which the fixed potential is applied.

APPENDIX 7

The signal transmission circuit according to appendix 5, wherein the output circuit includes a first transistor including a first electrode to which a fixed potential is applied, a second electrode configured to output the transmission signal, and a third electrode to which the fourth signal is applied and which controls conduction between the first electrode and the second electrode, and the first circuit further includes a second transistor in an ON state which has a first electrode connected to one end of the first coil and a second electrode to which the fixed potential is applied.

APPENDIX 8

A power conversion apparatus comprising:

an output line;

a first switching element having one end to which a fixed potential is applied and the other end connected to the output line;

a second switching element having one end connected to the output line and the other end to which a third potential is applied and configured to be turned on exclusively with respect to the first switching element;

a first signal transmission circuit as which the signal transmission circuit according to any one of appendixes 1 to 5 is adopted;

a second signal transmission circuit as which the signal transmission circuit according to any one of appendixes 1 to 5 is adopted; and a first latch circuit configured to output a signal for controlling whether to permit conduction of the first switching element, be set by the second signal output from the first signal transmission circuit, and be reset by the second signal output from the second signal transmission circuit, wherein both the second potential in the first signal transmission circuit and the second potential in the second signal transmission circuit are a potential of the output line.

APPENDIX 9

The power conversion apparatus according to appendix 8, further comprising:

a third signal transmission circuit as which the signal transmission circuit according to any one of appendixes 1 to 5 is adopted;

a fourth signal transmission circuit as which the signal transmission circuit according to any one of appendixes 1 to 5 is adopted; and a second latch circuit configured to output a signal for controlling whether to permit conduction of the second switching element, be set by the second signal output from the third signal transmission circuit, and be reset by the second signal output from the fourth signal transmission circuit, wherein both the second potential in the third signal transmission circuit and the second potential in the fourth signal transmission circuit are the third potential.

While the disclosure has been shown and described in detail, the foregoing description is in all aspects illustrative and not restrictive. It is therefore understood that numerous modifications and variations can be devised.

What is claimed is:

1. A signal transmission circuit comprising:

a first circuit, to which a first signal is input, configured to generate a transmission signal according to a change in a logical value of the first signal, and use a first potential as a reference for an operation;

a transformer including a first coil to which the transmission signal is input from the first circuit and a second coil inductively coupled to the first coil and configured to output a pair of reception signals; and a second circuit, to which the pair of reception signals are input from the second coil, configured to generate a second signal by performing comparison with hysteresis with respect to a potential difference between the pair of reception signals, and use a second potential as a reference for an operation, wherein the second circuit includes a detection circuit configured to perform the comparison and output a result of detecting whether the potential difference exceeds a predetermined range as the second signal, and a reset circuit configured to reset an operation of the detection circuit when a logical value of the second signal is maintained in a preset period.

2. The signal transmission circuit according to claim 1, wherein the second circuit further includes an offset circuit configured to generate a pair of third signals obtained by applying a DC voltage with reference to the second potential as an offset voltage to the pair of reception signals, and the detection circuit generates the second signal by performing the comparison with respect to a potential difference between the pair of third signals generated by the offset circuit.

3. The signal transmission circuit according to claim 2, wherein the offset circuit includes a first input terminal to which one of the pair of reception signals is input, a second input terminal to which the other of the pair of reception signals is input, a first output terminal to which one of the pair of third signals is output, a second output terminal to which the other of the pair of third signals is output, a first resistor having one end connected to the first output terminal and an other end to which the DC voltage is applied, a second resistor having one end connected to the second output terminal and an other end to which the DC voltage is applied, a first capacitor connected between the first input terminal and the first output terminal, and a second capacitor connected between the second input terminal and the second output terminal.

4. The signal transmission circuit according to claim 3, wherein the second circuit further includes a first clamp circuit and a second clamp circuit connected in series between the first input terminal and the second input terminal, the first clamp circuit includes a first diode, a second diode connected in parallel with the first diode and having a forward direction opposite to a forward direction of the first diode, and a first current limiting resistor connected in series to each of the first diode and the second diode, and the second clamp circuit includes a third diode, a fourth diode connected in parallel with the third diode and having a forward direction opposite to a forward direction of the third diode, and a second current limiting resistor connected in series to each of the third diode and the fourth diode.

5. The signal transmission circuit according to claim 4, wherein the first circuit includes a pulse generation circuit configured to generate a fourth signal in which a first pulse train having a plurality of pulses in a part of a period in which the first signal takes a first logical value and a second pulse train having a plurality of pulses following the first pulse train in the part occur, and an output circuit configured to generate the transmission signal according to a change in a logical value of the fourth signal, and one period of a pulse in the second pulse train is longer than one period of a pulse in the first pulse train.

6. The signal transmission circuit of claim 5, wherein the output circuit includes a transistor including a first electrode to which a fixed potential is applied, a second electrode configured to output the transmission signal, and a third electrode to which the fourth signal is applied and which controls conduction between the first electrode and the second electrode, and the first circuit includes a third resistor having one end connected to one end of the first coil and an other end to which the fixed potential is applied.

7. The signal transmission circuit according to claim 5, wherein the output circuit includes a first transistor including a first electrode to which a fixed potential is applied, a second electrode configured to output the transmission signal, and a third electrode to which the fourth signal is applied and which controls conduction between the first electrode and the second electrode, and the first circuit includes a second transistor in an ON state which has a first electrode connected to one end of the first coil and a second electrode to which the fixed potential is applied.

8. The signal transmission circuit according to claim 3, wherein the first circuit includes a pulse generation circuit configured to generate a fourth signal in which a first pulse train having a plurality of pulses in a part of a period in which the first signal takes a first logical value and a second pulse train having a plurality of pulses following the first pulse train in the part occur, and an output circuit configured to generate the transmission signal according to a change in a logical value of the fourth signal, and one period of a pulse in the second pulse train is longer than one period of a pulse in the first pulse train.

9. The signal transmission circuit of claim 8, wherein the output circuit includes a transistor including a first electrode to which a fixed potential is applied, a second electrode configured to output the transmission signal, and a third electrode to which the fourth signal is applied and which controls conduction between the first electrode and the second electrode, and the first circuit includes a third resistor having one end connected to one end of the first coil and an other end to which the fixed potential is applied.

10. The signal transmission circuit according to claim 8, wherein the output circuit includes a first transistor including a first electrode to which a fixed potential is applied, a second electrode configured to output the transmission signal, and a third electrode to which the fourth signal is applied and which controls conduction between the first electrode and the second electrode, and the first circuit includes a second transistor in an ON state which has a first electrode connected to one end of the first coil and a second electrode to which the fixed potential is applied.

11. The signal transmission circuit according to claim 2, wherein the first circuit includes a pulse generation circuit configured to generate a fourth signal in which a first pulse train having a plurality of pulses in a part of a period in which the first signal takes a first logical value and a second pulse train having a plurality of pulses following the first pulse train in the part occur, and an output circuit configured to generate the transmission signal according to a change in a logical value of the fourth signal, and one period of a pulse in the second pulse train is longer than one period of a pulse in the first pulse train.

12. The signal transmission circuit of claim 11, wherein the output circuit includes a transistor including a first electrode to which a fixed potential is applied, a second electrode configured to output the transmission signal, and a third electrode to which the fourth signal is applied and which controls conduction between the first electrode and the second electrode, and the first circuit includes a third resistor having one end connected to one end of the first coil and an other end to which the fixed potential is applied.

13. The signal transmission circuit according to claim 11, wherein the output circuit includes a first transistor including a first electrode to which a fixed potential is applied, a second electrode configured to output the transmission signal, and a third electrode to which the fourth signal is applied and which controls conduction between the first electrode and the second electrode, and the first circuit includes a second transistor in an ON state which has a first electrode connected to one end of the first coil and a second electrode to which the fixed potential is applied.

14. The signal transmission circuit according to claim 1, wherein the first circuit includes a pulse generation circuit configured to generate a fourth signal in which a first pulse train having a plurality of pulses in a part of a period in which the first signal takes a first logical value and a second pulse train having a plurality of pulses following the first pulse train in the part occur, and an output circuit configured to generate the transmission signal according to a change in a logical value of the fourth signal, and one period of a pulse in the second pulse train is longer than one period of a pulse in the first pulse train.

15. The signal transmission circuit of claim 14, wherein the output circuit includes a transistor including a first electrode to which a fixed potential is applied, a second electrode configured to output the transmission signal, and a third electrode to which the fourth signal is applied and which controls conduction between the first electrode and the second electrode, and the first circuit includes a third resistor having one end connected to one end of the first coil and an other end to which the fixed potential is applied.

16. The signal transmission circuit according to claim 14, wherein the output circuit includes a first transistor including a first electrode to which a fixed potential is applied, a second electrode configured to output the transmission signal, and a third electrode to which the fourth signal is applied and which controls conduction between the first electrode and the second electrode, and the first circuit includes a second transistor in an ON state which has a first electrode connected to one end of the first coil and a second electrode to which the fixed potential is applied.

17. A power conversion apparatus comprising:

an output line;

a first switching element having one end to which a fixed potential is applied and an other end connected to the output line;

a second switching element having one end connected to the output line and an other end to which a third potential is applied and configured to be turned on exclusively with respect to the first switching element;

a first signal transmission circuit and a second signal transmission circuit as each of which the signal transmission circuit according to claim 1 is adopted; and a first latch circuit configured to output a signal for controlling whether to permit conduction of the first switching element, be set by the second signal output from the first signal transmission circuit, and be reset by the second signal output from the second signal transmission circuit, wherein both the second potential in the first signal transmission circuit and the second potential in the second signal transmission circuit are a potential of the output line.

18. A power conversion apparatus comprising:

an output line;

a first switching element having one end to which a fixed potential is applied and an other end connected to the output line;

a second switching element having one end connected to the output line and an other end to which a third potential is applied and configured to be turned on exclusively with respect to the first switching element;

a first signal transmission circuit, a second signal transmission circuit, a third signal transmission circuit, and a fourth signal transmission circuit, as each of which the signal transmission circuit according to claim 1 is adopted;

a first latch circuit configured to output a signal for controlling whether to permit conduction of the first switching element, be set by the second signal output from the first signal transmission circuit, and be reset by the second signal output from the second signal transmission circuit; and a second latch circuit configured to output a signal for controlling whether to permit conduction of the second switching element, be set by the second signal output from the third signal transmission circuit, and be reset by the second signal output from the fourth signal transmission circuit, wherein both the second potential in the first signal transmission circuit and the second potential in the second signal transmission circuit are a potential of the output line, and both the second potential in the third signal transmission circuit and the second potential in the fourth signal transmission circuit are the third potential.

* * * * *